United States Patent [19]

Chamberlain

[11] Patent Number: 4,519,035
[45] Date of Patent: May 21, 1985

[54] BRANCHED-SPIRAL WAFER-SCALE INTEGRATED CIRCUIT

[75] Inventor: John T. Chamberlain, Macclesfield, England

[73] Assignee: Burroughs Corporation, Detroit, Mich.

[21] Appl. No.: 441,314

[22] Filed: Nov. 12, 1982

[30] Foreign Application Priority Data

Dec. 2, 1981 [GB] United Kingdom ............... 8136339

[51] Int. Cl.³ ............................................. G06F 13/00
[52] U.S. Cl. ............................................. 364/200
[58] Field of Search .......................... 371/21; 364/200 MS File, 900 MS File

[56] References Cited

U.S. PATENT DOCUMENTS

| 3,794,983 | 2/1974 | Sahin | 340/172.5 |
| 3,913,072 | 10/1975 | Catt | 340/172.5 |
| 3,961,251 | 6/1976 | Hurley | 324/73 AT |
| 4,037,205 | 7/1977 | Edelberg | 364/900 |
| 4,038,648 | 7/1977 | Chesley | 364/900 |
| 4,060,713 | 11/1977 | Golay | 364/416 |
| 4,191,996 | 3/1980 | Chesley | 364/200 |
| 4,215,401 | 7/1980 | Holsztynski | 364/200 |

OTHER PUBLICATIONS

R. C. Aubusson and I. Catt, "Wafer-Scale Integration—A Fault-Tolerant Procedure", IEEE Jo. of Solid State CKts, vol. SC-13, No. 3, Jun. 1978, pp. 339-344.
F. B. Manning, "An Approach to Highly Integrated, Computer-Maintained Cellular Arrays", IEEE Transactions on Computers, vol. C-26, No. 6, Jun. 1977, pp. 536-552.

*Primary Examiner*—Raulfe B. Zache
*Assistant Examiner*—Florin B. Munteanu-Ramnic
*Attorney, Agent, or Firm*—Mark T. Starr; Edmund M. Chung; Kevin R. Peterson

[57] ABSTRACT

A wafer-scale integrated circuit has a plurality of data-processing cells disposed on a semiconductor wafer together with a port for providing communications with a controller. A branched spiral of inter-coupled working cells is grown starting at the port by testing cells and incorporating them into the branched spiral if found to be working, otherwise selecting alternative cells for testing. The growth of the branched spiral is such as to allow for the incorporation of cells trapped in cul-de-sacs. Each cell is operable to receive a unique cell name from the controller and is thereafter operable to respond to commands from the controller bearing its unique cell name to couple firstly to one neighbor and secondly, at any time thereafter, to couple to a further neighboring cell. The controller is provided with means for maintaining records of successful interconnections for later use.

28 Claims, 12 Drawing Figures

BRANCHED-SPIRAL WAFER-SCALE INTEGRATED CIRCUIT

I hereby claim foreign priority benefits under Title 35, U.S. Code, para. 119 of United Kingdom Patent Application No. 81 36339, filed Dec. 2, 1981.

BACKGROUND TO THE INVENTION

1. Field of the Invention

The present invention relates to wafer-scale integrated circuits where there are a plurality of selectably interconnectable cells on the surface of a semiconductor substrate together with one or more ports and, starting at a port, the cells are testable and connectable in an overall working structure whose configuration is in part dependent on which of the cells pass the test.

2. The Prior Art

It is known to operate an integrated circuit and controller combination to connect cells in a simple, one-dimensional, unbranching chain across the face of an integrated circuit. The controller sends instructions to the terminal cell in the chain for connection to be made to a selectable neighboring cell. The controller then tests the newly-connected neighboring cell. If the test is passed the connection is confirmed and the last tested cell becomes the new terminal cell of the chain, ready to connect to another cell to test it. If the test is not passed, the original terminal cell is instructed by the controller to connect to an alternative, as yet untested neighboring cell. This is continued until a working neighbor is found. If no working neighbor is found, the controller severs connection to the terminal cell and examines the as yet untested neighbors of the previous terminal cell. This process of shedding the terminal cell and effectively shrinking the chain is continued until a terminal cell is found which has a previously-untested working neighbor which passes the test. The new-found working neighbor then becomes the new terminal cell and chain-growth is continued. Chain growth is stopped by the controller when either all accessible cells on the integrated circuit have been incorporated in the chain or when the chain has grown to include at least a predetermined number of cells.

The simple chain growth described has the disadvantage of rendering an unacceptably large number of cells non-incorporable into the chain. Every time the controller retreats down the chain by shedding terminal cells a cul-de-sac of cells which are known to be working is left behind. In a poly cellular wafer-scale integrated circuit having seventy percent of its cell capable of passing the functional test and where the thirty percent of non-functional cells are randomly distributed over the surface of the integrated circuit, as many as fifty percent of those cells capable of passing the test can be lost to the chain.

It is also known to operate an integrated circuit and controller combination to connect cells in a complex labyrinth across the surface of the integrated circuit. Each of the cells is in receipt of global commands from the controller. The cells are so configured that each can be connected to from any neighbor and can establish connection to any neighbor which has not already established connection to it. The global signals from the controller are used to cause inter-state stepping in a state machine in each cell. The state machine controls the flow of data in each cell and monitors the progress of the functional test either its own cell or a neighboring cell might be undergoing. The state machine then elects whether the functional test has been passed or not and whether or not inter-cell couplings are to be confirmed. The controller supplies instructions and data for the functional testing. The state machine operates in a first mode when it is first interrogated from a neighboring cell. It sets its cell into a sequence of operations which allow the cell to be the subject of the functional test. If its cell passes the test, the state machine confirms its new-found first connection. If its cell does not pass the test, the state machine shuts down the cell. Having passed the test, a subject cell becomes a tester cell, its state machine selecting a neighboring cell which has not yet had connection established thereto to turn that neighboring cell into a subject cell. At the end of the labyrinth growth, when either all accessible cells have been incorporated into the labyrinth, or when the labyrinth comprises at least a predetermined number of cells, the state machines are collectively placed in a state wherein the integrated circuit becomes a functional data processing element.

The labyrinth of connected cells is extremely efficient in picking up cells, capable of passing the functional test, for incorporation. Its growth is also quite rapid compared to the growth of a chain, since in the chain growth can occur from only one point at a time, while in the labyrinth growth occurs from all tester cells simultaneously.

The labyrinth-connectable integrated circuit has the considerable disadvantage of having, in each cell, a very high proportion of circuit elements concerned only with the state machine and with the monitoring of the functional test. The data processing capacity of each cell is thereby drastically reduced, since there is an optimum area size for each cell beyond which the proportion of functional cells becomes unacceptably low.

There are situations where, despite its efficiency, the labyrinth is incapable of incorporating a very high proportion of potentially usable cells. Since the cell connecting strategy is contained within the state machine in each cell, it is out of the control of the external controller, which can therefore do nothing to modify connections. The exact topology of the labyrinth is also undiscoverable to the controller. The controller cannot therefore take note of a successful growth pattern and reimpose it at a later time without the time wasting delay of reperforming the growth routine. The individual cells are autonomous in their interconnections, and cannot be instructed by the controller, even if it could discover the topology of the labyrinth, to selectably change or establish any inter-cell connection without the strategy and actual performance of the limited repertoire of the state machine.

It is therefore desirable to provide a combination comprising a polycellular integrated circuit and a controller wherein the controller is capable of knowing the topology of the tested and interconnected structure of cells, where the controller can select the inter-cell connections of each cell according to a controller-contained strategy allowing the incorporation of a high proportion of potentially usable cells, where the controller is provided with a simple method and apparatus for controlling that strategy, and where an already-discovered interconnection pattern can be re-imposed on an integrated circuit without the necessity for wasting time repeating the test-and-select routine which originally established the pattern of connection.

SUMMARY OF THE INVENTION

According to a first aspect, the present invention consists in an integrated circuit comprising a plurality of functionally testable cells, each cell being selectably operable to receive a connection from a first neighboring cell and thereafter selectably operable to establish connection to any selectable one, or more than one, other neighboring cells, at least one out of said plurality of cells being adjacent to a port for connecting a controller to said at least one of said cells.

According to a second aspect, the present invention consists in an integrated circuit according to the first aspect wherein each of said cells comprises a name register for receiving a unique cell name from said controller immediately subsequently to said receipt of connection from said one neighboring cell, a name comparator for comparing an address name on instructions from said controller with said cell name and for providing indication when said address name is identical to said cell name, and an instruction decoder operable in response to said indication by said comparator to decode the instruction accompanying said address name identical to said cell name and to provide indication of which one out of a plurality of instructions is to be obeyed.

According to a third aspect the present invention consists in an integrated circuit according to the first and/or second aspects wherein said plurality of cells forms a regular tessellation across its surface, wherein said each of said cells comprises as many data paths as it has neighboring cells having a common boundary with said each of said cells, and further comprises data switching means which is selectably operable in response to indication by said instruction decoder to select, as the data input to each of said data processing elements, either the data output of a data processing element in said each of said cells or the data output of a data processing element in a particular neighboring cell.

According to a fourth aspect the present invention consists in a controller for use with an integrated circuit according to the second and/or third aspects comprising; means for selecting a unique cell name for each new cell connected into the operational part of the integrated circuit and for transmitting said unique cell name to said last connected cell, means for maintaining a record of connection direction into each cell incorporated in the circuit, and means for maintaining a record of connection direction out of each cell which is incorporated in the operational part of the integrated circuit.

According to a fifth aspect the present invention consists in a controller according to the fourth aspect including means for sending interconnection commands to the integrated circuit according to the contents of its record of cell name, direction of connection into each cell and direction of connection out of each cell such that a previously discovered pattern of cell interconnection can be reestablished without passing through a repeated test routine.

According to a sixth aspect the present invention consists in a controller according to the fourth or fifth aspects comprising means for instructing each newly incorporated cell to connect to a selectable neighboring cell, and means operable thereafter for testing the neighboring cell, said controller also comprising means for selecting another neighboring cell for testing if the neighboring cell previously under test failed the test, and for recording in association with the cell name indication when no neighboring cell to that cell whose name is recorded passed the test.

According to a seventh aspect, the present invention consists in a controller according to the sixth aspect comprising means, operable in the event of all neighboring cells failing said test, to command another cell to couple to a selectable, as yet untested neighboring cell for it to be tested and, if passing said test, to be incorporated into the operation of the integrated circuit, while maintaining all previously established connections between cells which have passed said test.

BRIEF DESCRIPTION OF THE PREFERRED EMBODIMENT

In a preferred embodiment a silicon wafer substrate preferably has fabricated thereon a plurality of integrated circuit cells. The cells are preferably data processing cells. The data processing cells are preferably memory cells. All of the cells on the wafer are preferably identical to one another.

The wafer preferably comprises a port for coupling a controller to the wafer. The port preferably allows for connection to at least one of the cells to be established by the controller for passing data and instructions to that cell. The port is preferably formed by the omission of one of the cells from one of the tessellation sites on the wafer which would otherwise have been occupied by a cell, and the provision of coupling to at least one of the cells adjacent to that site. The port preferably also allows provision for power supplies and universal, global signals to be coupled to all of the cells on the wafer simultaneously. The port is preferably but not necessarily at or near the edge of the wafer.

The controller is preferably coupled to the port by a bidirectional controller bus. The controller is preferably coupled in turn to a host system by a bidirectional host bus. The controller preferably operates in two modes, in a first mode controlling the establishment of an operational body of cells on the wafer, and in a second mode acting as an intermediary between the host and the wafer for data processing purposes. When the cells are memory cells, the controller preferably acts as an organizing intermediary for the host to store and retrieve data in conjunction with the cells.

Each cell is preferably square, thereby having four neighboring cells around it in a tessellation except when that cell is at the edge of the wafer or adjacent to the port.

Each cell preferably comprises a data steering gate at each of its boundaries with its neighbors. Each cell preferably includes four data processing elements. The data processing elements are preferably data storage memory modules. Informational data preferably proceeds through each memory module monodirectionally between an input and an output. The memory modules are preferably connected intermediary between pairs of the gates for the transfer of data therebetween. Each gate is preferably commandable to steer incoming signals from the output of one memory module selectably either to the input of the memory module next round in the cell, or to steer the incoming signals across the boundary of the cell to the corresponding antipodal gate on a neighboring cell in which case the antipodal gate of the neighboring cell provides the trans-boundary input as the data input to a memory module and transfers back across the boundary the data output of one of its memory modules to be coupled by the gate in the cell in question as the input to the next-round memory module in the cell.

A monitor is preferably incorporated into the cell for providing switching commands to the gates and for interpreting when a command is destined to be obeyed by the cell.

Each cell preferably receives a command and address bus from one of its neighbors when incorporated into the body of tested cells. The command and address bus preferably conveys a word which is interpretable by the cell either as a command or an address. Each cell preferably receives global signals. The global signals are preferably indicative of whether word on the the command and address bus is a cell name to be written into a cell name register, a cell address to be compared with the cell name to indicate that the following word on the command and address bus is a command to be obeyed by the cell whose name is identical to the address, and a command to be obeyed wherever said match is found. The cell name is preferably inhibited from being written in the cell name register unless the cell is the last one so far incorporated into the body of cells.

Each cell preferably generates an open signal for each of its neighbors in response to commands from the controller via the command and address bus. The open signal preferably allows a selectable neighbor to be coupled to from the addressed cell. The neighbor preferably resists being coupled to if it is already incorporated into the body of tested cells. Once coupled to, a new cell is preferably tested by the controller utilizing it as part of the data structure and checking backcoming data against outgoing data.

Each cell preferably is operable in response to commands from the controller to generate a confirm signal to selectable neighbors subsequently to the passing of the functional test by the neighbor. The neighbor preferably responds to the confirm signal by maintaining coupling to the cell providing the confirm signal. The confirm signal is preferably latched, in which case the latch is preferably situated in the cell generating the confirm signal.

The command and address bus is preferably coupled across the boundary of a cell to a neighboring cell whenever an open signal or a confirm signal is so coupled.

In performing inter-cell coupling the controller preferably selects a first test direction and tests the cell adjacent to the port in that direction. If the cell passes the test the cell is incorporated and the test direction swung round by ninety degrees in a first direction. The first direction is preferably clockwise. The newly incorporated cell preferably then tests the neighboring cell in the new test direction. If a cell fails the functional test the test direction, instead of being swung ninety degrees in said first direction, is preferably swung ninety degrees in a second direction. The second direction is preferably counter-clockwise. If no neighboring cell can be found to the last incorporated cell which can pass the test, either resultantly upon already being incorporated and resisting coupling or resultantly upon physical failure of some part of its operation, the controller preferably seeks back along the body of incorporated cells in the reverse order of their incorporation until a cell is found with an as yet untested neighbor which can pass the test. The newly tested neighbor is then incorporated and growth of the body of tested cells continued from there, to form a branching of the body of cells.

The controller preferably comprises a stack register, the last entry of which is visible to it. Each time a new cell, having passed the test, is incorporated, the cell name is preferably entered into the stack as the latest entry. The direction from which connection was established is preferably recorded in the stack in conjunction with the cell name. If no neighbor is found which can pass the test, the latest entry in the stack is preferably discarded to make the earlier entry in the stack visible. The controller preferably uses said earlier entry as new data for starting a search for a neighbor which can pass the functional test.

The controller preferably comprises a cell name counter. The cell name counter preferably starts at zero and is incremented by one for each newly incorporated cell.

The controller preferably comprises a direction counter. The direction counter is preferably a two-bit counter whose output is indicative of the test direction. The direction counter preferably rolls over from 00 to 11 and vice versa. When clockwise rotation of the test direction is required the direction counter is preferably decremented by one and when counter-clockwise rotation of the test direction is required the direction counter is preferably incremented by one.

The controller preferably comprises a list. The list preferably includes the cell name of each cell as it is incorporated. In association with each cell name the list preferably records the direction from which connection was established to each incorporated cell. The list preferably includes indication in conjunction with the cell name of any cell which is found to have no neighbors capable of being coupled to and passing said test.

The controller preferably comprises means for storing the list in a non-volatile memory. The controller is preferably operable to employ the stored list to re-establish the pattern of earlier incorporated cells without recourse to repeating the test and connect process.

The controller preferably comprises means for copying said list into a removable ROM or PROM. The ROM or PROM is preferably usable by a simpler controller to re-establish the previously discovered pattern of interconnected cells without recourse to the test and connect operation.

The present invention is further described, by way of an example, by the following description in conjunction with the appended drawings, in which;

DETAILED DESCRIPTION OF THE PREFERRED EMBODIMENT

Figure 1:
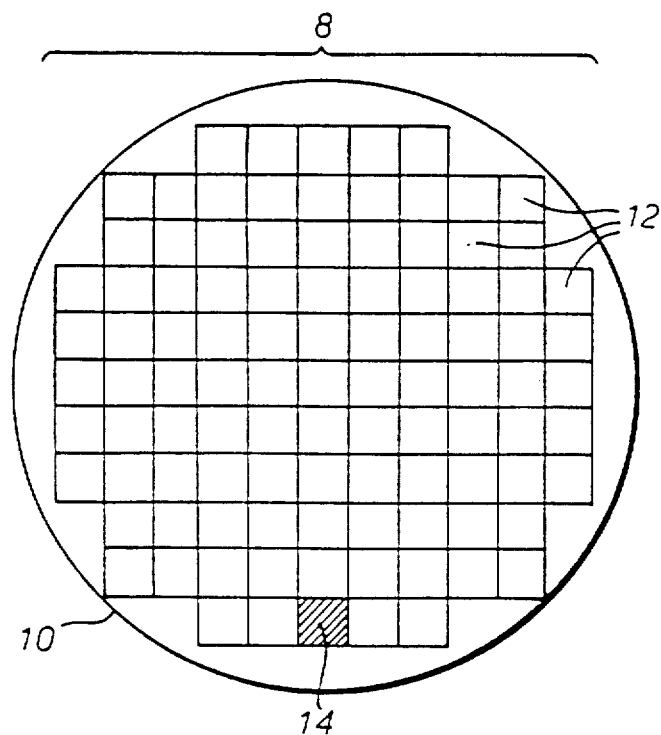
FIG. 1 shows a wafer scale integrated circuit according to the present invention.

FIG. 1 shows a wafer-scale integrated circuit of the type appropriate to the present invention.

The wafer-scale integrated circuit 8 consists in a circular, semiconductor wafer 10 whereon are constructed a plurality of integrated circuit cells 12. The cells 12 are square and form a regular tessellation across the surface of the wafer 10. One of the cells 12 is missed out from the tessellation to form a port 14. The port 14 allows for connection between the integrated circuit 8 and the outside world. Connections are made with one or all of the cells 12 adjacent to the port 14. The port 14 in this example is shown situated at the edge of the wafer 10. It is to be appreciated that, in general, the port 14 can also be central. There can be more than one port. The coupling can be achieved to the outside world other than through a port formed by omission of a cell 12 from the tessellation. In particular the provision of connections to the edge of the body of cells 12 on the wafer is acceptable. It is also to be appreciated that the wafer 10 can be any substrate of any shape allowing for the provision thereon of a body of cells 12 which are of the type later described.

Figure 2:
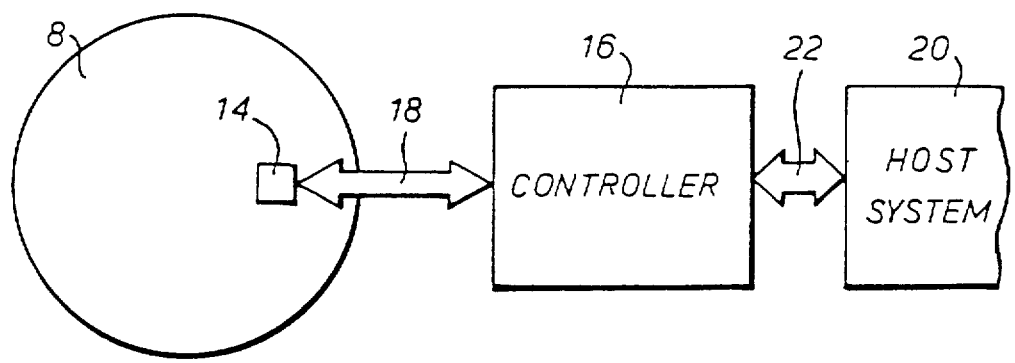
FIG. 2 shows the relative interconnections between the integrated circuit, the associated controller and the host system which they serve.

FIG. 2 shows the interrelationship between the integrated circuit 8 and the outside world.

The integrated circuit 8 is bidirectionally coupled to a controller 16 by a controller bus 18 which communicates with the circuit 8 via the port 14. The controller 16 is responsible firstly, for supervising and controlling the testing and interconnection of cells 12 in a branched spiral of data processing elements starting at the port 14. The controller 16 is thereafter responsible for acting as a supervising intermediary between a host system 20 and the integrated circuit. In the present example, the cells 12 are data storage cells, so that the controller 16 acts as a memory interface.

During the growth phase the controller 16 builds a circuit according to the specification of the host. The host can command the controller 16 via the host bus 22. The host 20 can tell the controller 16 to grow an array of data storage cells up to a selectable capacity, or can tell the controller to grow the array until all accessible and working cells are incorporated in the array. The controller 16 signals the host 20 when it is finished growing and thereafter the host bus 22 becomes a bidirectional data path for data from the host 20 to be stored in the circuit 8 and for data retrieved from the the circuit 8 to be passed back to the host 20.

Figure 3:
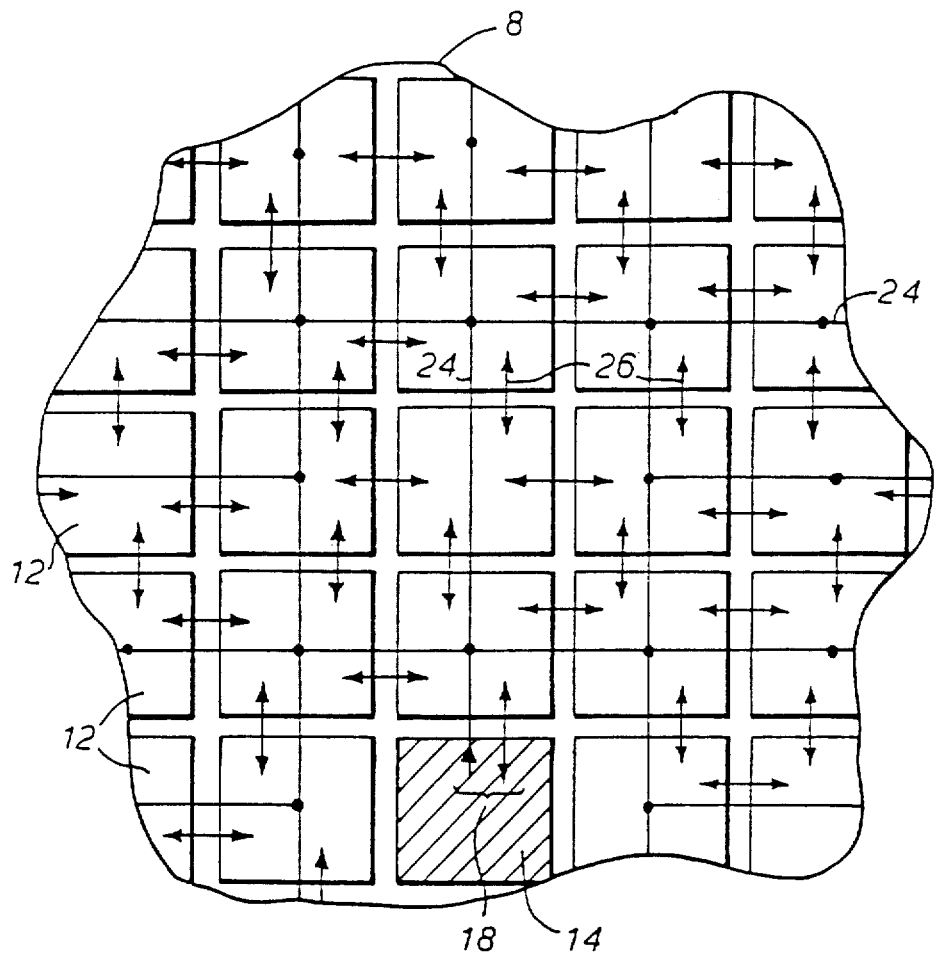
FIG. 3 shows, in schematic form, the interconnections between the cells and the port on an exemplary portion of the wafer.

FIG. 3 shows the interconnections between the port 14 and the cells 12, and the interconnections from cell to cell 12, on an exemplary portion of the circuit 8.

The controller bus 18 provides a first, global connection 24 which provides various signals to all of the cells 12 simultaneously. The controller bus 18 also provides a bidirectional data and control coupling 26 to one of the cells 12 adjacent to the port 14.

Each of the cells has four neighbors. A bidirectional data and command coupling 26 is provided between the cell 12 and each of four neighbors with which it shares a common boundary, Thus each cell 12 has four bidirectional data and command couplings 26 communicating across its four boundaries. The data and command couplings 26 are used firstly to transfer data from cell 12 to cell 12 for data processing, and secondly to transfer command signals from cell 12 to cell 12 for the control of inter-cell 12 connections.

The global connection 24 is distributed to all cells 12 by a pattern of metalization overlaying the wafer 10. In the particular example chosen for description the global connection 24 carries power and clock signals to each cell 12. It is to be appreciated that various schemes exist for distributing clock signals from cell to cell 12 in a non-global manner, and that they can be preferable in that they allow for the continuing functioning of cells 12 which would otherwise have been rendered non-functional by nothing more than the loss of a global clock line, of which there is in general an unacceptably high risk. However, the exact manner of clock signal distribution is not of importance to the description of the present invention.

It is also to be appreciated that whereas in FIG. 3 the controller bus 18 is shown as coupling to just one cell 12 adjacent to the port 14, there is no reason why connection between the controller 16 and the integrated circuit 8 should not be made to all of the adjacent cells 12 to the port 14 and indeed, where there is more than one port 14, to some or all of the cells 12 adjacent thereto, provided means are provided for the controller 16 to distinguish between one cell 12 and another when the controller 16 communicates with them.

It is to be appreciated that those cells 12 at the edge of the integrated circuit 8 or indeed adjacent to the port 14 but not coupled to the controller 16 in any direction manner, have fewer than four neighbors with whom they share a common boundary, and that the number of data and command couplings 26 for these cells 12 is correspondingly reduced.

Figure 4:
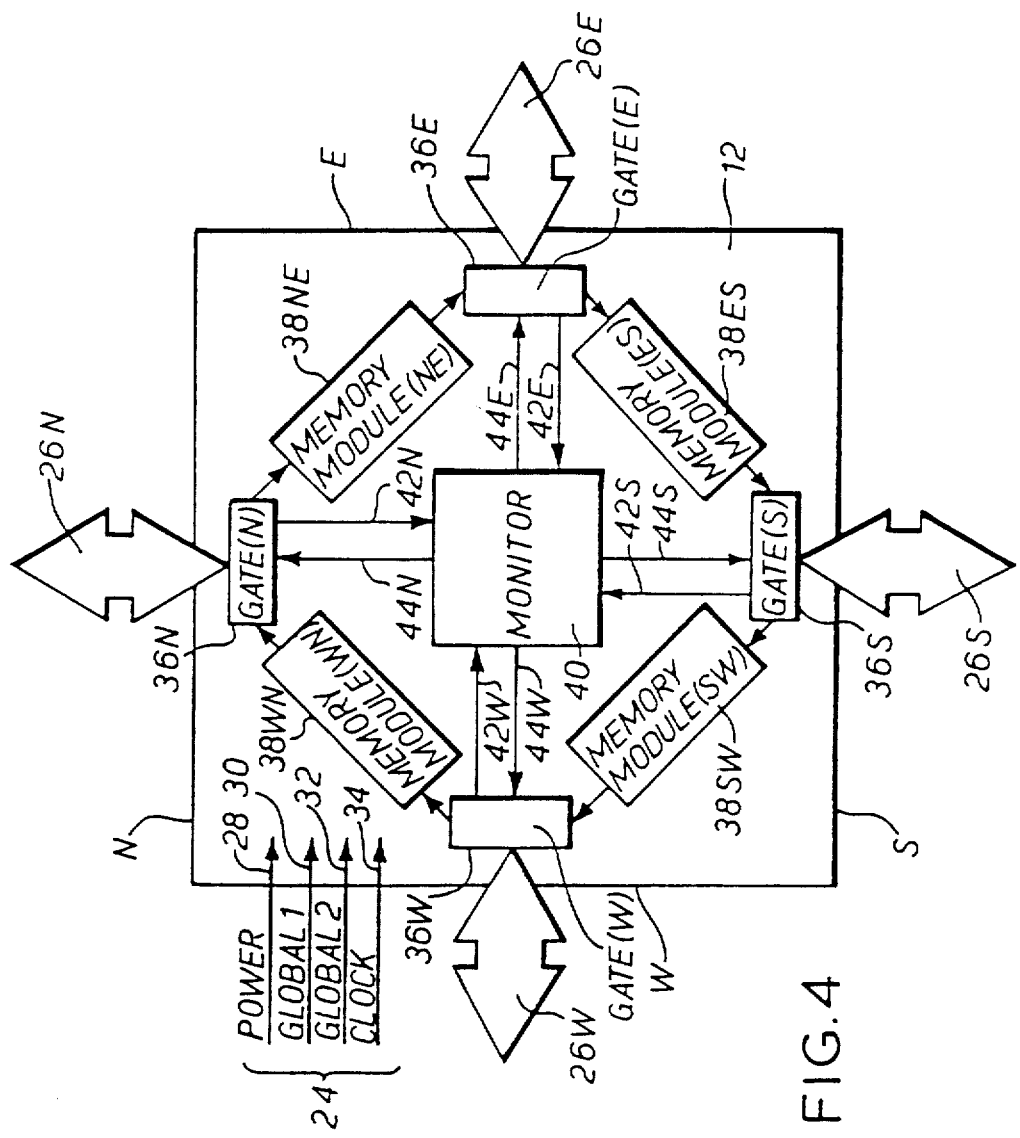
FIG. 4 shows, in schematic form, the various elements constituting a cell.

FIG. 4 shows schematic detail of the contents of each cell 12 and of the connections thereto.

The global connection 24 provides a power line 28 supplying energy to the cell 12, a first global line 30 providing a first global signal, a second global line 32 providing a second global signal, and a clock line 34 providing a repetitive clock signal for use in data processing operations.

The cell 12 has four boundaries designated north N, south S, east E, and west W, respectively. Each of the boundaries N,S,E,W is provided with a gate 36N, 36S, 36E and 36W, respectively where the suffix denotes the boundary with which the gate 36 is associated. Each gate 36N, 36S, 36E, 36W communicates with its respective data and command coupling 26N, 26S, 26E, 26W. The gates 36N, 36S, 36E, 36W are selectably operable to receive data to be processed across the boundaries N S E W respectively and to divert processed data to the neighbouring cell associated with each boundary.

The cell 12 is provided with four data processing elements 38WN, 38NE, 38ES and 38SW coupled between the pairs of gates 36W and 36N, 36N and 36E, 36E and 36S, and 36S and 36W respectively. The data processing elements 38 are monodirectional, receiving data to be processed at an input and providing data which has been processed at an output. The first letter of the two letter suffix in the designation of the data processing elements 38 indicates on which boundary N, S, E or W is the gate 36 which provides the data input to be processed. The second letter of the two letter suffix indicates on which boundary N, S, E or W is the gate 36 to which the data processing element 38 delivers up its processed data.

The gates 36N, 36S, 36E, 36W are each selectably and independently operable to provide the processed data each receives from the data processing element whose output is coupled thereto 38WN, 38ES, 38NE, and 38SW respectively as the input to the data processing element 38NE, 38SW, 38ES, and 38WN respectively which each gate 36N 36S 36E 36W feeds with input data.

The data and command couplings 26N 26S 26E 26W not only provide and receive data to be processed, but also provide commands to be obeyed by the cell 12. The commands to be obeyed by the cell 12 are passed on through each gate 36N, 36S, 36E, 36W respectively to a monitor 40 via a command input line 42N, 42S, 42E, 42W respectively from each gate 36N, 36S, 36E, 36W.

The monitor 40 is in receipt of the first and second global lines 30, 32 and of the clock 34. The monitor 40 determines which instructions are to be obeyed by the cell, determines when an instruction is to be obeyed by the cell 12, and passes on instructions to other cells 12 in accordance with the previously provided instructions from the controller 16. The monitor provides these passed-on instructions through the gates 36N, 36S, 36E, 36W via a command output line 44N, 44S, 44E, 44W respectively to each gate, the gate to which it goes 36N, 36S, 36E, 36W responding to the passing-on by selecting the mode of data steering where the data passes to and fro across the respective boundary N, S, E, W rather than being passed from data processing element 38 to data processing element 38 within the cell 12.

In the particular example of the preferred embodiment of the present invention the data processing elements 38NE, 38ES, 38SW, 38WN are described as memory modules. In the present description it is assumed that all four elements 38WN, 38NE, 38ES, 38SW are identical to one another. This is not at all necessary to the operation of the present invention, neither is it necessary that the data processing elements are memory modules. The only requirement that is placed upon the elements 38 is that they each possess an input and an output.

When a memory module is used, this can have any one of many configurations. In their very simplest form the modules 38 might be no more than a serial, data storage shift register. More sophisticated devices are employable storing data in selectable locations, which might be shift register recirculating stores or more normal, bistable flip-flop semiconductor cells. Structures are possible using more than one chain of shift registers, for example where a slow data storage chain is flanked by a parallel 'fast' access line and a parallel 'control' line, together with a changeover switch operable in response to characters in the control line to switch the outputs or inputs of the fast and data storage lines over. Monitoring circuits are acceptable within each module 38 for determining when a match has occurred between control characters and stored data so that associative addressing can take place. Each module can be made capable of decoding and responding to instructions passed from module to module around the circuit 8. While the modules 38 have so far and will later be described as if the flow of signals therein is unidirectional, it is to be appreciated that many types of module exist wherein some signals are passed in a forward direction and some passed in a backward direction. This is perfectly acceptable within the context of the present invention as will become clear. Further, whereas the modules 38 are herebefore and hereafter described as if they had only a single line going into them and a single line coming out, it is to be understood that the single line described is, if needs be, representative of as many lines of whatever type necessary to provide for the operation of each module 38.

Figure 5A:
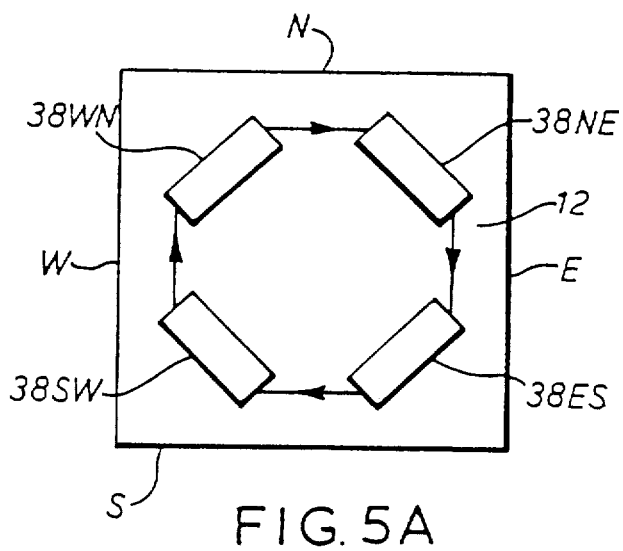
FIG. 5A shows the manner of steering data inside each cell.

FIG. 5A shows the first manner of data steering by the gates 36 between the modules 38. This particular configuration is in effect never encountered in the operation of the present invention except in cells 12 which are capable of working but which have not yet been accessed by any neighboring cell for potential incorporation into the array of cells 12. The example was chosen as being best illustrative of the manner of operation of the gates 36.

Whenever a cell 12 is not accessed from a particular direction or whenever the monitor 40 in the cell 12 does not pass on its commands to another cell 12, the gate 36 reverts to passing the data around the inside of cell. In FIG. 5A the situation is shown where neither the monitor 40 communicates out from the cell nor any other neighbor wishes to communicate with the cell.

Figure 5B:
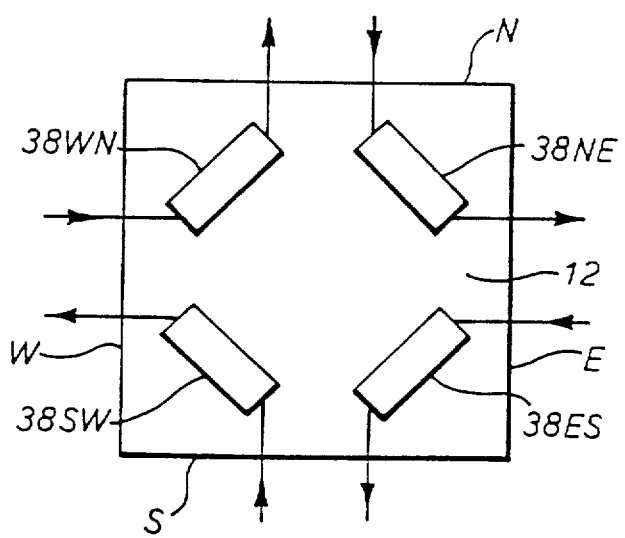
FIG. 5B shows the manner of steering data across the boundaries of each cell.

FIG. 5B shows the opposite situation from that of FIG. 5A. In FIG. 5B the cell 12 is accessed from a first direction and in turn the monitor 40 in the cell 12 has accessed the remaining three neighboring cells 12. This situation can occur during a backing out operation from two branches of the spiral which is to be described.

The situation was chosen as being illustrative of the second manner of operation of the gates 36.

Whenever the cell 12 is accessed from a neighbor, or whenever the cell 12 seeks to access a neighbor, the gate 36 in the appropriate direction opens to allow data coupling to that neighbor. When accessed from a neighbor, the gate 36 will not open if the cell 12 has already been accessed from another direction. Similarly, when the cell 12 tries to access a neighbor, coupling is resisted by the neighbor if that neighbor has already been accessed from another direction. In the example shown no such restriction is present. The data, instead of being coupled around inside the cell 12 from one memory module 38 to another, is passed accross the boundary N, S, E, W of the cell 12 by the gate 36 which in turn receives data to be coupled into its outgoing memory module as earlier described.

Figure 6:
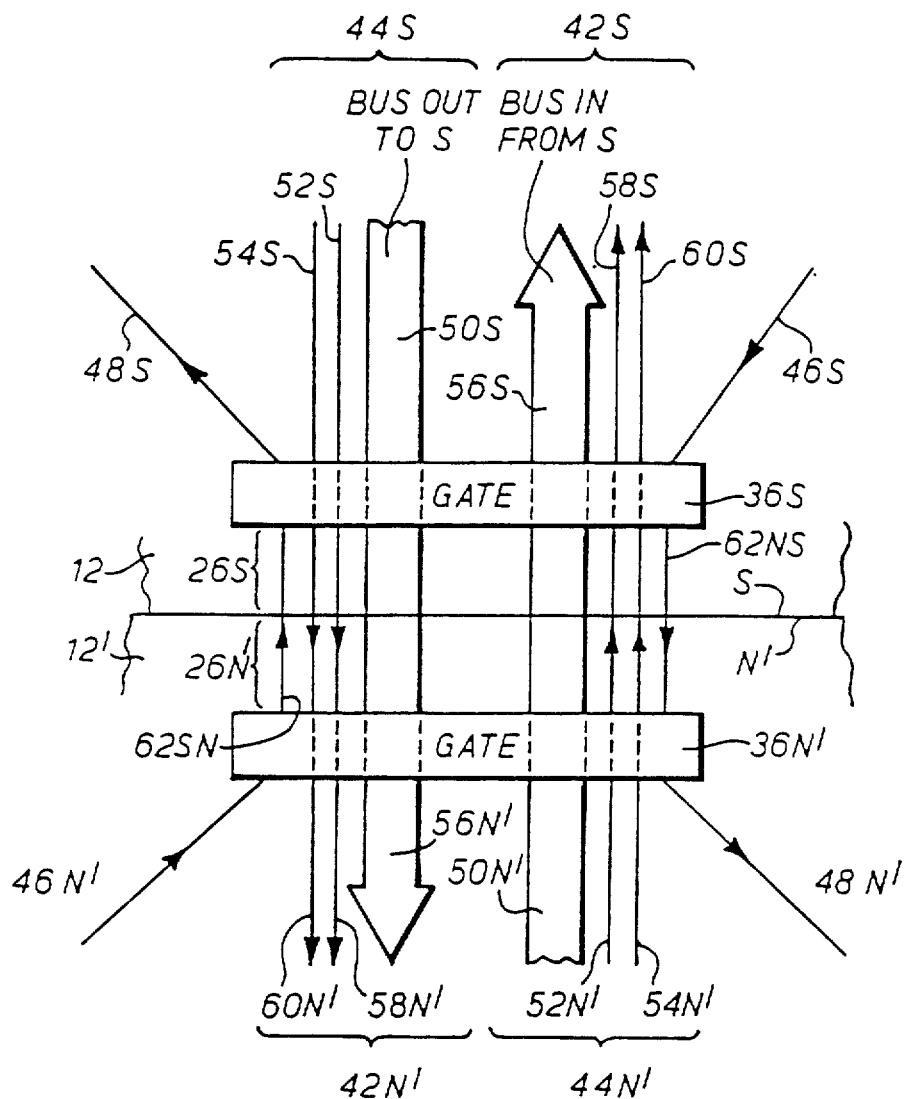
FIG. 6 shows schematically, in detail, the various signals crossing each inter-cell boundary.

FIG. 6 shows fine, schematic detail of the coupling across the boundaries of the cells between the gates.

Two cells 12 are shown, a first cell 12 communicating across its southern boundary S and a second cell 12' communicating across its northern boundary N'. The apostrophe in the designation of parts in the following description is indicative of that part belonging to the second cell 12'. The southern boundary of the first cell 12 is of course identical with the northern boundary of the second cell 12'. The southern data and command coupling 26S of the first cell 12 is identical with the nothern data and command coupling 26N' of the second cell 12'. The first gate 36 receives data from its feeding module 38ES (not shown) along a data input line 46 and provides data to the module 38SW (not shown) next round in the cell 12 on a data output line 48. The second gate 36N' of the second cell 12' receives data from its feeding module 38WN' (not shown) along a second data input line 46' and provides data to the module 36NE' (not shown next round in the second cell 12' via the second data output line 48'.

The command output line 44S of the first cell 12 passes through the gates 36S, 36N' to become the command input line 42N' of the second cell 12'. The command output line 44N' of the second cell 12' passes through the gates 36N', 36S to become the command input line 42S of the first cell 12.

The command output lines 44S, 44N' each comprise an 8 bit wide command bus 50S, 50N', an open line 52S, 52N' going out to the adjacent cell indicating that it is desired to access that cell, and a confirm line 54S, 54N' going out to the adjacent cell and indicating that coupling is to be consolidated thereto.

The command input lines 42S, 42N' each comprise an 8 bit wide command input bus 56S, 56N', an open input line 58S, 58N' for indicating when the neighboring cell wishes to establish access, and a confirm input line 60S 60N' for indicating that the neighboring cell wishes to consolidate coupling.

The command output bus 50N' of the second cell 12' having crossed the boundary S, N' becomes the command input bus 56S of the first cell 12. The command output bus 50S of the first cell 12, having crossed the boundary S, N' becomes the command input bus 56N' of the second cell 12'. The open output line 52N' of the second cell 12' becomes the open input line 58S of the first cell 12 on crossing the boundary. The open output line 52S of the first cell 12, on crossing the boundary S, N' becomes the open input line 58N' of the second cell 12'. The confirm output line 54N' of the second cell 12' becomes the confirm input line 60S of the first cell 12. The confirm output line 54S of the first cell 12 becomes the confirm input line 60N' of the second cell 12'. A first data transfer line 62NS transfers data between the first gate 36S and the second gate 36N' and a second data transfer line 62SN transfers data between the second gate 36N' and the first gate 36S. By means of these couplings the first cell 12 and the second cell 12' are able to be connected to form part of the branched spiral of cells of the present invention. It is to be understood that all four boundaries N, S, E, W of each cell 12 are the same, only the suffixes designating the various elements requiring to be changed for their description.

Whenever the open out line 52S of the first cell becomes logically true, indicating that the first cell 12 wishes to access the second cell 12', the first gate 36S responds by coupling the signal from the data input line 46S to the first data transfer line 62NS and by coupling the signal on the second data transfer line 62SN as the signal on the data output line 48S. The first gate 36S responds in exactly the same manner to the signal on the confirm output line 54S becoming logically true indicatively of the first cell 12 desiring to consolidate its coupling to the second cell 12'. When the signal on the the open out line 52S is logically false and the signal on the confirm out line 54S is logically false, the first gate 36S responds by coupling the signals on the data input line 46S to the data output line 48S.

Whenever the signals on the open out line 52N' of the second cell 12' are logically true, indicatively of the second cell 12' wishing to access the first cell 12, the second gate 36N' responds by coupling the signal from the second data input line 46N' to the second data transfer line 62SN and by coupling the signal on the first data transfer line 62NS to the second data output 48N'. The second gate 36N' responds in exactly the same manner to the signal on the second confirm out line 54N' becoming logically true indicatively of the second cell 12' desiring to consolidate its coupling to the first cell 12. When the signal on the second open out line 52N' and on the second confirm out line 54N' are simultaneously logically false, the second gate 36N' responds by coupling the signal on the second data in line 46N' to the second data out line 48N'.

Thus, in order to establish coupling between the two cells it is necessary for both cells to respond to one another.

In the particular example of the preferred embodiment the coupling is achieved as follows. Firstly the initiating cell, say the first cell 12, raises the signal on its open out line 52S to become logically true. The first gate 36S responds by adopting the coupling described above. This is not of course enough to establish coupling to the second cell 12' since both the first gate 36S and the second gate 36N' are required to co-operate to give the desired result. The second cell 12' responds to the signal on its open in line 58N'. If the second cell 12' has not already been accessed from another direction, it responds by raising the signal on its open out line 52N' causing the second gate 36N' to adopt the configuration described and co-operate with the first gate 36S to achieve the desired coupling. If the second cell 12' has already been accessed from another direction it resists the coupling attempt by the first cell 12 by failing to raise the signal on its open cut line 52N'.

The coupling between the two gates 36S, 36N' achieved by the mutual raising of the signals on the appropriate open out lines 52S 52N' is only temporary, since, as will be described later, the maintaining of the signal on the open out line 52S, 52 N'in a logically true condition is a temporary measure which can be countermanded by the controller 16 by later instructions to the cell 12, 12'. The coupling to the other cell is rendered permanent by use of the confirm out lines 54S 54N'. Again, as is described below, the confirm out signals on the lines 54S, 54N' are latched signals, generated in response to further commands from the controller 16 by each cell 12, 12'. During the temporary coupling from the raising of the signals on the open out lines 52S, 52N' the controller 16 subjects the new cell which in this case is the second cell 12', to a functional test. If the second cell 12' passes the test the controller 16 instructs the first cell 12 and the second cell 12' to raise and latch the confirm out signals on the confirm out lines 54S, 54N'. The first and second gates 36S, 36N' respond in just the same way they responded to the signals on the open out lines 52S, 52N' and the coupling between the two cells 12, 12' is confirmed and consolidated. If the second cell 12' does not pass the test, the controller 16 instructs the first and second cells 12, 12' to cease supplying a logically true signal on their respective open out lines 52S, 52N'. The first and second gates 36S, 36N' respond as earlier described and the temporary coupling established for functional testing is abandoned.

Figure 7:
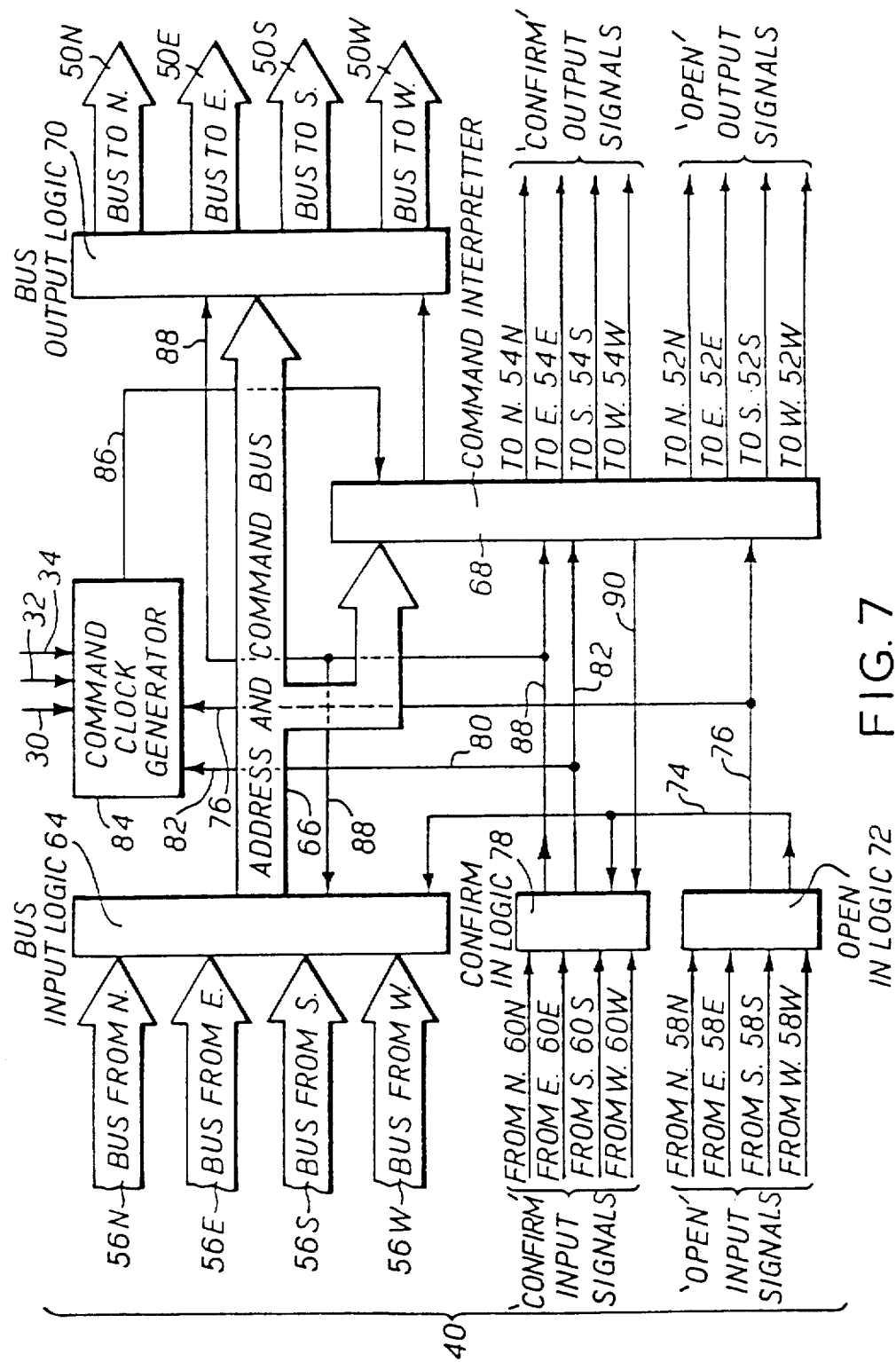
FIG. 7 shows, in schematic form, the elements constituting the monitor of FIG. 4.

FIG. 7 shows, in schematic outline, the various constituent parts of the monitor 40 of FIG. 4.

Bus input logic 64 receives the command input buses 56N, 56E, 56S, 56W from the corresponding boundaries N E S W and selects one of them to be provided as the input to the address and command bus 66 which is internal to the monitor 40. The address and command bus 66 is provided firstly as the input to a command interpreter 68 and secondly as the input to bus output logic 70 which is operable to couple the signals on the address and command bus 66 to any one or more of the command output buses 50N, 50E, 50S, 50W going back to their respective boundaries N, E, S, W. The bus output logic 70 is inhibited from coupling back across the boundary from whence the signal on the address and command bus 66 is received.

Open input logic 72 receives the signals from the open input lines 58N, 58E, 58S, 58W coming from their respective boundaries, N, E, S, W and provides first indication on an open in direction line 74 of the direction from which the open input signal is received and second indication on an open input received line 76 indicatively of an open input signal being received by the cell 12.

Confirm input logic 78 receives the signals on the confirm in lines 60N, 60E, 60S, 60W from their respective boundaries N, E, S, W and provides first indication on a contirm direction line 80 of the direction from which a confirm input signal is being received and second indication on a confirm input received line 82 that a confirm signal is being received.

A command clock generator 84 interprets the signals on the first global line 30, the second global line 32 and the clock line 34 to provide indication to the command interpreter 68 via the command clock line 86 whether the parallel 8 bit binary word on the address and command bus 66 is a cell name to be noted down for later use, an address for an instruction, or an instruction to be obeyed.

The confirm in logic 78 provides a third, latched output 88 indicating from which direction the confirm in signal was first received, thereby indicating the entry direction to the cell 12. This signal is important for controlling the later accessing of the cell from other directions. The output is used to inhibit the cell from accepting approaches from other neighbors. It is also used to prevent the cell 12 from trying to access the neighbour from which it was first approached. The latched output 88 of the confirm in logic 78 is coupled firstly to the bus output logic 70 to prevent it from providing the signals on the address and command bus 66 back in the direction from which the cell 12 receives them. The latched output 88 of the confirm input logic 78 is also provided as a coupling inhibiting input to command interpretting logic 68. The command interpreter 68 receives the cell name from the address and command bus 66 when the command clock generator 84 indicates that the word thereon is a cell name and when the cell 12 has not before been accessed from any direction, receives a cell address word from the bus 66 when the command clock generator 84 indicates that the word on the bus 66 is a cell address, compares the cell address word with the previously stored cell name, and, if there is a match, decodes a subsequently supplied command word from the bus 66. The interpreter 68 is operable to provide the open out signals on the open out lines 52N, 52S, 52E, 52W and to provide the signals on the confirm out lines 54N, 54S, 54E, 54W. In response to receipt of the latched output 88 of the confirm in logic 78, should the interpreter 68 be commanded to provide an open signal back in the direction of first approach, it will not do so, and furthermore will temporarily drop the confirm out signal in that direction just to break the coupling in that direction and force an error.

The bus input logic 64 is also in receipt of the latched output 88 of the confirm in logic 78 and responds thereto by not permitting any other command input bus 56N, 56S, 56E, 56W from being selected as the signal for switching through onto the address and command bus 66 other than that from the direction from which a confirm in signal was first received.

The command interpreter 68 is operable, in response to a command from the controller 16, to provide a signal on a reset line 90 to which the confirm in logic 78 responds by abandoning the indication on its latched output.

It should be noted that during any period when the interpreter 68 refused to provide the open out signal back in the direction from which first confirm input was received and temporarily drops the confirm out signal in that direction, the bus input logic 64 continues to couple the input bus 56 from the direction of first confirmation onto the address and command bus 66. This allows the cell 12 to receive subsequent instructions and so not become alienated from the rest of the integrated circuit 8.

It will be appreciated by those skilled in the art that the precautionary measures described with reference to the interpreter 68, the bus input logic 64 and the bus output logic 70 could be omitted and incorporated in the activity of the controller 16. The measures are here included firstly illustratively of how they can be implemented and secondly because their incorporation into the cell provides a further line of defense against improper operation over those in the controller 16.

Figure 8:
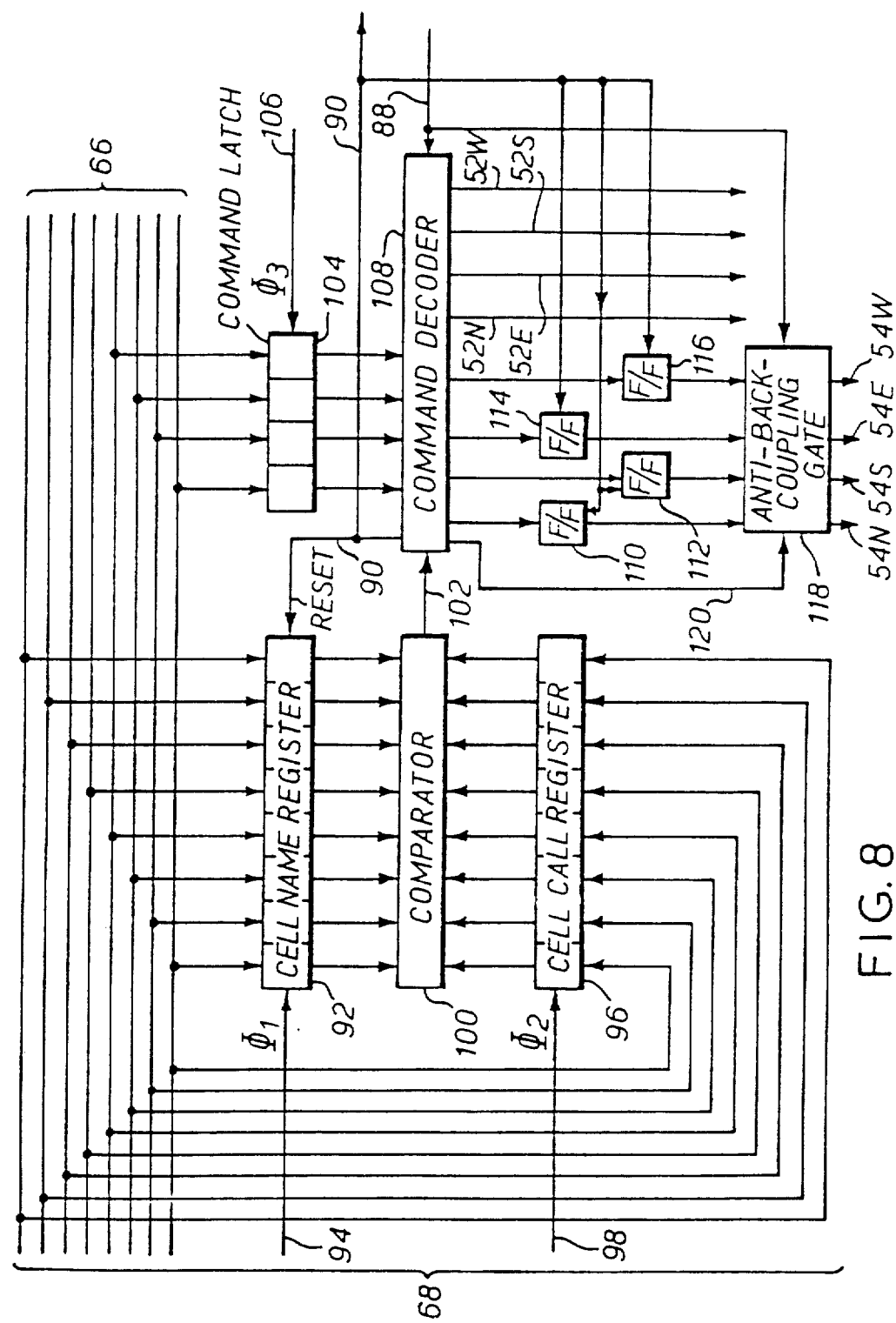
FIG. 8 shows, in schematic form, details of the elements constituting the command interpreter of FIG. 7.

FIG. 8 is a detailed schematic drawing of the interpreter 68 of FIG. 7.

The address and command bus 66 is 8 bits wide. An eight bit cell name register 92 is in receipt of all eight lines from the command and address bus 66 and, when strobed via a first command clock line 94, which is part of the clock line 86 of FIG. 7, accepts the word on the address and command bus 66 as the cell name.

An eight bit address register 96 is also in receipt of all eight bits from the address and command bus 66. When strobed via a second command clock line 98, which is also part of the clock line 86 of FIG. 7, the address register 96 accepts the word on the command and address bus 66 as the address of a cell which is required to obey a following instruction.

The eight bit parallel output of the cell name register 92 is provided as a first input to a numerical comparator 100. The eight bit parallel binary digit output of the address register 96 is provided as a second input to the comparator 100. The comparator 100 compares its two input numbers and provides indication on a comparator output line 102 when the two input numbers are equal. The two numbers being equal is indicative of the cell 12 where the equality is found being the one for which a following command is destined.

A four bit wide command register 104 is in receipt of the signals of just four of the lines of the address and command bus 66 and when strobed via a third command clock line 106, also part of the clock line 86 of FIG. 7, accepts and stores the command word on the four lines it receives from the bus 66.

The four latched bits from the command register 104 are provided as the input to a command decoder 108. The command decoder 108 also receives the output of the comparator 100 as an enabling input from the comparator output line 102 such that the decoder 108 only provides meaningful output if the number stored in the address register 96 equals the number stored in the cell name register 92 indicating that the command is destined for that cell.

Table 1 shows the command decoder listing of instructions.

TABLE 1

| RESPONSES OF COMMAND DECODER 108 | |
|---|---|
| INPUT WORD | OUTPUT RESPONSE |
| 0000 | Do Nothing |
| 1000 | Strobe Reset Line 90 |
| 1001 | Confirm out to North |
| 1010 | Confirm out to East |
| 1011 | Confirm out to South |
| 1100 | Confirm out to West |
| 1101 | Open out to North |
| 1110 | Open out to East |
| 1111 | Open out to South |
| 0001 | Open out to West |

The table shown is merely illustrative of how the decoding might be implemented. It will be apparent that any instruction list using four input bits or more will function equally as well.

The decoder 108 provides the four open out signals on the four open out lines 52N, 52S, 52E, 52W. Whenever an instruction is received indicating that an open out signal is to be applied, the decoder 108 raises the signal on the appropriate one of the lines 52N, 52S 52E, 52W.

The decoder provides the confirm out signals to the north, south, east and west to first, second, third and fourth confirm out latches 110, 112, 114, 116 respectively. The latches 110, 112, 114, 116 are individually strobed when the decoder 108 receives an instruction indicating that a confirm out line should be raised, maintaining their value until reset.

The decoder 108 provides an output on the reset line 90 whenever it receives the reset instruction. The reset line firstly clears the cell name register 92 back to zero contents, resets the confirm out latches 110, 112, 114, 116 and clears the maintained indication from the confirm in logic 78 of the first direction from which a confirm input signal was received. The reset line 90 is thus usable as an initializing line for use after the integrated circuit 8 has been powered up. It is of course to be appreciated that the registers which can be reset 110, 112, 114, 116, 92 & 78 can also be provided with means whereby they always come up in a zero state when power is applied to the integrated circuit 8, in which case the reset line becomes an auxiliary means of initializing the cell. It is of interest that as soon as the cell name register 92 is cleared, the cell 12 drops out from the main body of cells and cannot be addressed again until reapproached from a neighbor. The controller 16 can thus remove cells from main body of cells simply by telling them to drop out. This action is not necessarily part of the branched-spiral growth growth routine and pattern of the present invention.

The outputs of the confirm out latches 110, 112 114, 116 are provided as the input to an anti-back-coupling gate 118.

The latched output 88 of the confirm in logic 78 is provided both as input to the decoder 108 and as input to the anti-back-coupling gate 118. The decoder 108 responds to the indicated direction of the latched output 88 of the confirm in logic 78 indicating the direction from which a confirm in signal was first received by refusing to respond to any 'open out' command in that direction, and by providing a match indication to the anti-back-coupling gate 118 via a match line 120. The anti-back-coupling gate 118 responds to the match indication from the decoder 108 by being enabled to cut off the confirm out signal on the appropriate confirm out line 54N, 54S, 54E, 54W which lies in the same direction as that indicated to it by the confirm in logic 78 via its latched output 88. The temporary suspension of the confirm out signal to the direction of first coupling is maintained until the controller 16 issues a further command of any other kind to the cell 12.

Figure 9:
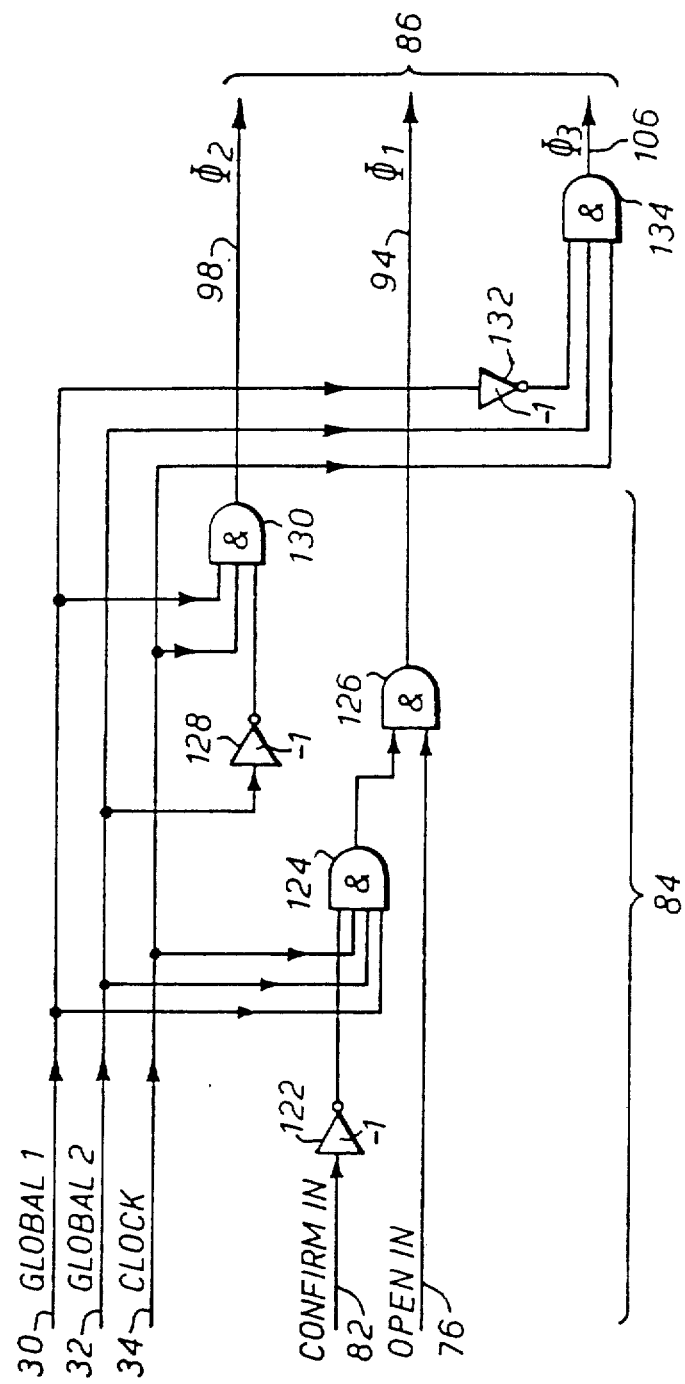
FIG. 9 shows schematic detail of the command clock generator of FIG. 7.

FIG. 9 shows schematic detail of the construction of the command clock generator 84 of FIG. 7.

The first clock signal on the first command clock line 94, used to strobe the cell name register 92, is generated by a first logic invertor 122, a first AND gate 124 and a second AND gate 126 such that, the repetitive clock signal on the clock line 34 is allowed through onto the first command clock line 94 if and only if the first and second global signals on the first and second global lines 30, 32 respectively are simultaneously true, the signal on the confirm in received line 82 is logically false indicating that the cell 12 is not yet in receipt of a confirm in signal from any direction, and the signal on the open in received line 76 is logically true indicating that an open in signal has been received from some direction. This condition can only occur during and immediately subsequently to functional testing of the cell 12 when it has been approached for the first time, so that the cell name register 92 can only be strobed during first approach to the cell and before the cell 12 has received confirmation of coupling from a first neighbor.

The second command clock signal on the second command clock line 98, used to strobe the cell address register 96 indicatively of the word on the data and address bus 66 being the address of a cell required to obey the next subsequent instruction, is generated by a second logical invertor 128 and a third AND gate 130 such that the repetitive clock signal on the clock line 34 is allowed through onto the second command clock line if and only if the first global signal on the first global line 30 is logically true and the second global signal on the second global line 32 is logically false.

The third command clock signal on the third command clock line 106 used to strobe the command register 104 indicatively of the four bit word on certain ones of the lines of the address and command bus 66 being a command word to be obeyed by the cell with the address match, is generated by a third logic invertor 132 and a fourth AND gate 134 such that, the repetitive clock signal on the clock line 34 is allowed through onto the third command clock line 106 if and only if the first global signal on the first global line 30 is logically false and the second global signal on the second global line 32 is logically true.

When the signal on the first global line 30 is logically false and the signal on the second global line 32 is also false, the repetitive clock signal on the clock line 34 is provided to none of the command-clocked elements 92, 96, 104 so that their conditions remain unchanged. The repetitive clock signal on the clock line 34 is also supplied to the memory modules 38 of FIG. 4 to supervise their data processing operations.

The particular construction of the command interpreter 68 shown in the present description is merely exemplary of one manner of its implementation. Those skilled in the art will be able to generate other methods for its implementation based on the above description. Similarly the exact manner of construction of the clock generator 84 is also exemplary. Other coding schemes will be apparent based on the above description, as well as the methods of their implementation.

The first and second global lines 30, 32 are shown in this embodiment as being supplied to all cells 12 simultaneously. It is to be appreciated that the global lines 30, 32 could be conducted from cell to cell 12 in the integrated circuit 8 in much the same way as the signals on the command and address bus 66, and indeed, could be treated as part of that bus 66. A similar treatment could be given to the clock signal on the clock line 34, moving it around with the bus 66.

Figure 10:
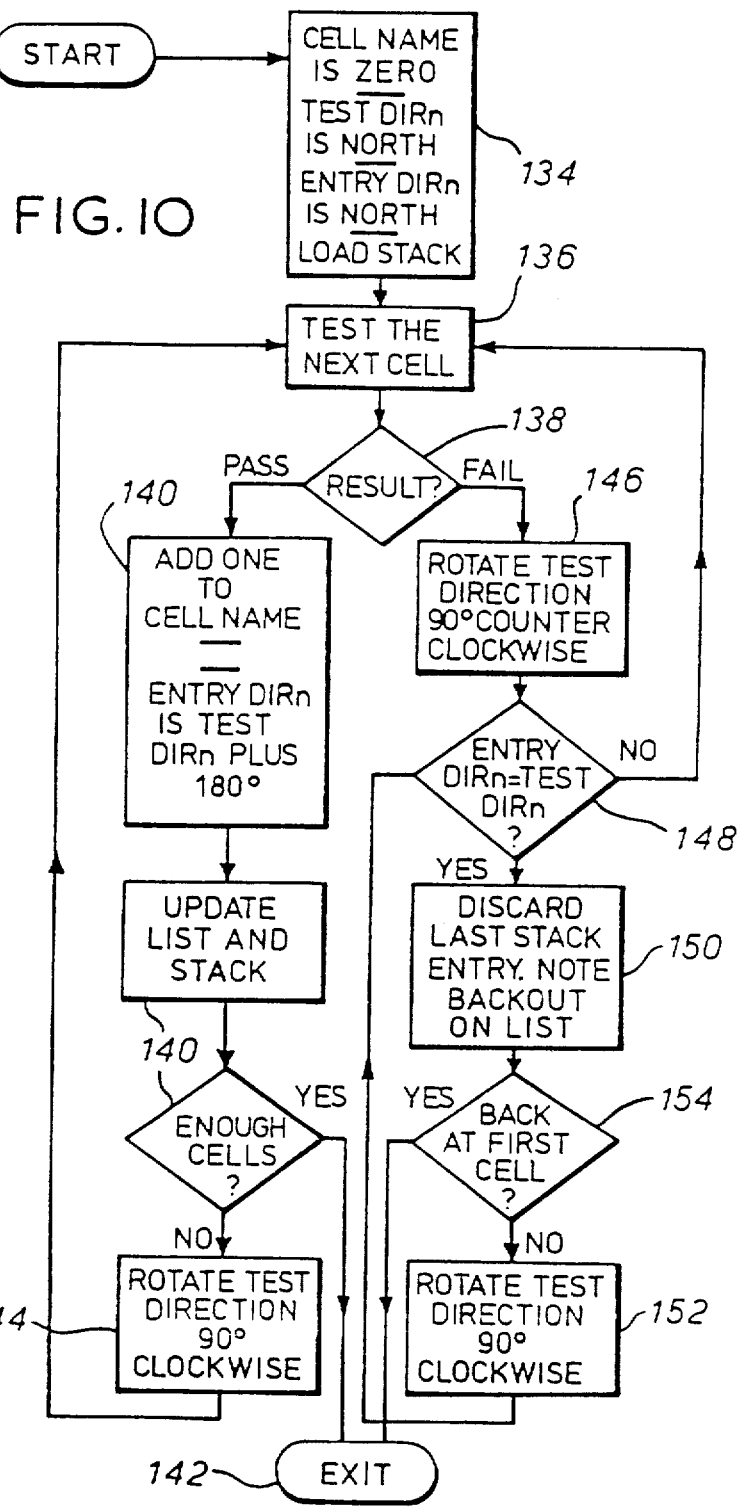
FIG. 10 shows a flow diagram of the activity of the controller.

FIG. 10 shows a flow chart of the activities of the controller 16 in growing the branched spiral of interconnected, tested data processing cells characteristic of the present invention.

At the start of the growth phase the controller 16 performs an initializing process 134. As earlier described, the controller 16 comprises a cell name counter. During initialization it sets the contents of the cell name counter to zero. Similarly, the controller 16 comprises a bidirectionally operable test direction counter, two bits long, working according to the listing; 00=North, 01=East, 10=South, 11=West. It will be appreciated that other counting schemes would equally well be suitable. During the initializing phase 134 the contents of the test direction counter are set to zero. The controller 16 maintains a record of the entry direction, that is, the boundary N, S, E or W across which a cell 12 is first coupled to by a neighbor. During the initiating phase 134 the entry direction record is artificially set to be the same as the test direction that is, the boundary across which a cell reaches out to a neighbor, so that in a later swinging round process, to be described below, all neighbors to a testing cell are accessed in the search for one to couple to. In this particular example both the test and entry directions are set to north, it being understood that any other direction would have sufficed.

During the initialization the stack, also earlier described as a constituent part of the controller 16, is loaded with the cell name (zero) and the entry directions are entered into the stack.

Thereafter the controller 16 tests the cell 12. The exact manner of the testing phase 136 is of no great importance to the present invention. The controller 16 commands the last incorporated cell 12 to access the neighbor in the current test direction. In the case of the very start of testing, the very first cell is effectively the port 14 and it accesses the first cell 12 to the north by raising the open line to it. The first cell 12 to the north is required to raise its open line for the gates 36 to couple to one another. However, in receiving the open in signal the neighboring cell automatically receives signals onto the command and address bus 66. The cell to be tested is not yet in receipt of any confirm in signal. The first command clock signal on the first command clock line 94 is therefore in a position to be activated. The controller makes the signals on the first and second global lines 30, 32 both true. places the cell name onto the bus 66, and waits for the signal on the repetitive clock line 34 to load the cell name into the cell name register 92. The cell 12, thus loaded with its name, is able to receive specific commands. The controller 16 next loads the cell address register 96 with the cell name it just loaded into the cell name register 92 by manipulation of the signals on the first and second global lines 30, 32 and the signals on the bus 66 as earlier described so that the command following the loaded address will be obeyed by the cell 12 which is to be tested. The controller then manipulates the signals on the first and second global lines 30, 32 and on the four command bits of the bus 66 to load a command into the command register 104 to be decoded by the now enabled command decoder 108. The exact command which the controller 16 loads to the cell 12 to be tested causes the cell 12 to raise its open out signal back in the direction of its approach. This opens its gate 36 to the neighboring cell 12 from which the approach is being made.

In any newly coupled cell 12 only one of the gates 36 is open to a neighbor. Thus data to be processed enters from the neighbor and is coupled in a loop through all of the modules 38 and back to the neighbor. There is no possibility of any other manner of coupling being encountered, since any other manner of coupling would mean that the cell has already been approached from another direction and, as earlier stated, a cell coupled to from one direction resists further approaches from other directions.

The functional testing of the cell 12 can be accomplished in any suitable manner. For example, the controller 16 can supply test data to be circulated round the cell 12 to be tested. The controller 16 then compares the data it puts out with the data it receives back and, if the return data is as the controller 16 expected it to be, then the cell 12 is deemed to have passed the test. Alternatively, the cell 12 might include elements for determining whether predetermined relationships exist between the input characters to the modules 38 and the output characters. Such a relationship might be parity, in which case the controller 16 would provide the loop of modules in the cell 12 to be tested with appropriate run-length-repetitive data such that the outgoing data from the modules satisfies the parity requirement either with the input to the same module or the output of another module 38. The data checking elements in each cell 12 might be provided with means of signalling back to the controller 16 when they detect an error, perhaps via a global line but much more preferably by some kind of return line or lines piped around the integrated circuit 8 with the signals on the bus 66 and communicating back to the controller 16. The character and sophistication of the tests will be entirely determined by the nature of the modules 38, be they memory circuits or other data processing devices. As earlier stated, the exact nature of the modules, and of their testing, is not part of the present invention, save that the modules 38 in a cell 12 are required to pass the functional test before the cell 12 can have its coupling confirmed from the neighbor which approached it.

At the end of functional testing the controller 16 makes a decision 138 as to whether the newly-approached cell 12 has passed the test. Dependently upon the nature the nature of the modules 38 the decision can be based on modules being anywhere from 100% functional to being in part not functional but having enough residual function to justify their incorporation into the activity of the integrated circuit 8.

A cell 12 which fails the test must be shut down by being reset. The controller 16 firstly stops the failed cell from providing an open out signal back in the direction from which it was approached by issuing it with a do nothing command. Then the cell name is recalled from the cell name register 92 by the controller 16 issuing the reset command which has the effect of causing the word in the cell name register 92 to become zero. Lastly the cell 12 which approached the failed cell 12 is caused to cease providing the failed cell with an open out signal. This can be achieved by the controller 16 causing the cell 12 which made the approach to obey any other command. When a new test direction is to be tried, the cell which made the approach drops its open out signal to the failed cell by being commanded to raise its open out signal in another direction. When all test directions have been exhausted the cell which made the approach is issued with a do nothing command.

The effect of the cell which made the approach abandoning its open out signal to the failed cell is for the address and data bus 66 of the failed cell to cease receiving any input. The failed cell 12 cannot thereafter be addressed with any instructions unless subsequently accessed from another direction. The cell name which was previously but abortively installed in the cell name register 92 of the failed cell 12 becomes free for re-use in testing another cell.

If the cell which is being tested passes the test, it is necessary for the coupling to it to be confirmed. To this end, the controller 16 issues the cell 12 which has been tested with an instruction causing it to raise the signal on its confirm out line 54 back in the direction from which the tested cell was approached. The confirm out signal being latched, the raising of the signal on the confirm out line 54 has the effect of causing the gate 36 on the boundary with the cell 12 which made the approach to become permanently open in the direction of approach (unless the confirm out signal is subsequently reset). The controller 16 then commands the cell 12 which made the approach to the tested cell 12 to raise the signal on its confirm out line 54 in the direct direction of the tested cell 12 so that the gate 36 on the boundary with the tested cell 12 becomes permanently opened. The coupling between the tested cell 12 and the cell 12 making the approach is thereby placed on a solid footing. The temporary open out signals from the two cells 12 are of course lost during the raising of the confirm out signals, but this is of no consequence.

When the cell 12 has passed the test and its coupling into the activity of the integrated circuit 8 has been confirmed, the controller 16 passes into a housekeeping phase 140. The controller 16 firstly adds one to the cell name by incrementing the cell name counter as earlier described. The new cell name is then ready to be installed into the cell name register 92 of a new cell 12 to be tested. The controller 16 adds two to the contents of the two bit test direction counter to establish the direction of entry of the latest incorporated cell 12, that is, the direction from which it was approached for incorporation. The controller 16 then adds the entry direction to the stack against the cell name. The controller 16 also makes an entry in a list noting down the cell name and its direction of entry. Thereafter the controller 16 compares the new, incremented cell name in the cell name counter with an upper number supplied to the controller by the host 20. If the new cell name equals the upper limit then there are enough cells incorporated into the operation of the integrated circuit 8 to satisfy the host 20 and the controller passes on to other things via an exit routine 142. If the new cell anme is not yet equal to or greater than the upper limit the controller 16 goes on to a test direction rotation operation 144.

It may be desired by the host 20 that the controller 16 incorporates all accessible, working cells 12 on the wafer. In order to achieve this end, the host 20 merely has to provide the controller 16 with an upper limit equal to or greater than the total number of cells 12 on the wafer 10. Alternatively, means can be provided for the host 20 to inhibit the controller 16 from performing the cell count test at all.

The test direction rotation operation 144 entered into if more cells 12 are required to be incorporated, merely consists in adding one to the test direction counter. After incrementing the test direction counter, thus causing the test direction to be rotated by ninety degrees clockwise, the controller passes back to the testing phase 136.

When a tested cell 12 has failed the test the controller 16 seeks another cell 12 for the cell which made the approach to the failed cell to couple to for testing. The controller 16 performs a counter-clockwise test direction rotation operation 146 by subtracting one from the contents of the test direction counter. The controller 16 then performs a test direction check 148 to determine whether the test direction is back at the entry direction. When each neighboring cell fails a test, an approaching cell 12 is made to couple to each in turn so that they all are subjected to the test, the search ceasing when one that passes the test is found. It is now apparent why the test direction and the entry direction were made identical during the initialization operation 134. If they are made equal than a search around all three neighbors is possible.

If the test direction has not yet swung back to face the direction of entry, the controller 16 moves back to the cell testing operation 136.

If the test direction has swung round to the entry direction, this means that all the neighbors to the cell 12 making approaches are unsatisfactory in some way. They may be already incorporated as a result of an approach from another direction. Alternatively, they may be non-functional. In the case of a cell 12 at the edge of the wafer 10, there may not be a neighbor to approach. In any of these cases, the cell making the approaches, that is, the cell 12 last incorporated, is at the tip of a cul-de-sac or blind alley of cells 12. The controller 16 therefore takes measures designed to back out of the cul-de-sac while retaining the connection of the working cells discovered within the cul-de-sac.

The controller 16 moves to a backout operation 150. The controller 16 discards the last entry in the stack. This exposes the previous entry to the stack. The entry direction to the previously incorporated cell and its name become visible to the controller 16, which now uses them to test all of the neighbors of the previously incorporated cell 12 until either the test direction swings back to the entry direction, or a working neighbor is found. The controller 16 achieves this end by performing a clockwise rotation of the test direction 152 in order to make the test direction and entry direction no longer equal, and passing back to the test operation 136 optionally via the direction test 148.

If, having performed one backout operation 150, all of the neighbors of the cell whose name is at the top of the stack are found to be inaccessible, then backout 150 is repeated, until it is discovered that even the very first cell at the port 14 has been reached, this condition being detected by an entry cell test 152 where the cell name at the top of the stack is compared against zero. It is essential to wait until after a repeat test of all of the zeroth cells neighbors before moving to the exit routine 142. To this end it is possible to make the entry cell test 154 conditional upon the zeroth cell having been tested. Alternatively, some means may be incorporated whereby the cell right at the port 14 is named 00000001 instead of 00000000 and a dummy 00000000 entry made in the stack purely for detection purposes just ahead of the 00000001 entry.

Every time a backout 150 is performed, the controller 16 notes against the entry in the list which gives the cell name of the cell 12 from which backout is being performed, that the cell 12 being backed from has no accessible neighbors and is therefore in a cul-de-sac. The list can be a simple RAM with the cell name used as an address input and the various entries stored in the locations so accessed. Alternatively, the list can be in a PROM, which can be removed from the controller 16 and transported in association with the wafer 10. It will be apparent how the contents of such a PROM can be used by any auxiliary controller to recreate the connection pattern discovered by the test and connect routine of FIG. 10. As anothr variant, the controller 16, by using techniques which will be apparent to those skilled in the art, by storing the list in an electrically maintained volatile RAM, or in a non-volatile RAM, can achieve the same purpose as the auxiliary controller described above. The controller 16 can accommodate a special PROM burner for making transportable permanent copies of the list stored in its RAM.

The controller 16 can be a hard wired state machine or its operation can be accommodated within the operations of a data processor. In particular the operations of the controller 16 can be absorbed into the work of the host system 20.

Having configured the cells 12 on the wafer 10, the exact manner of operation of the controller 16 when subsequently acting as an interface to the host 20 will be dependent upon the nature of the modules 38 and does not form part of the present invention.

Figure 11:
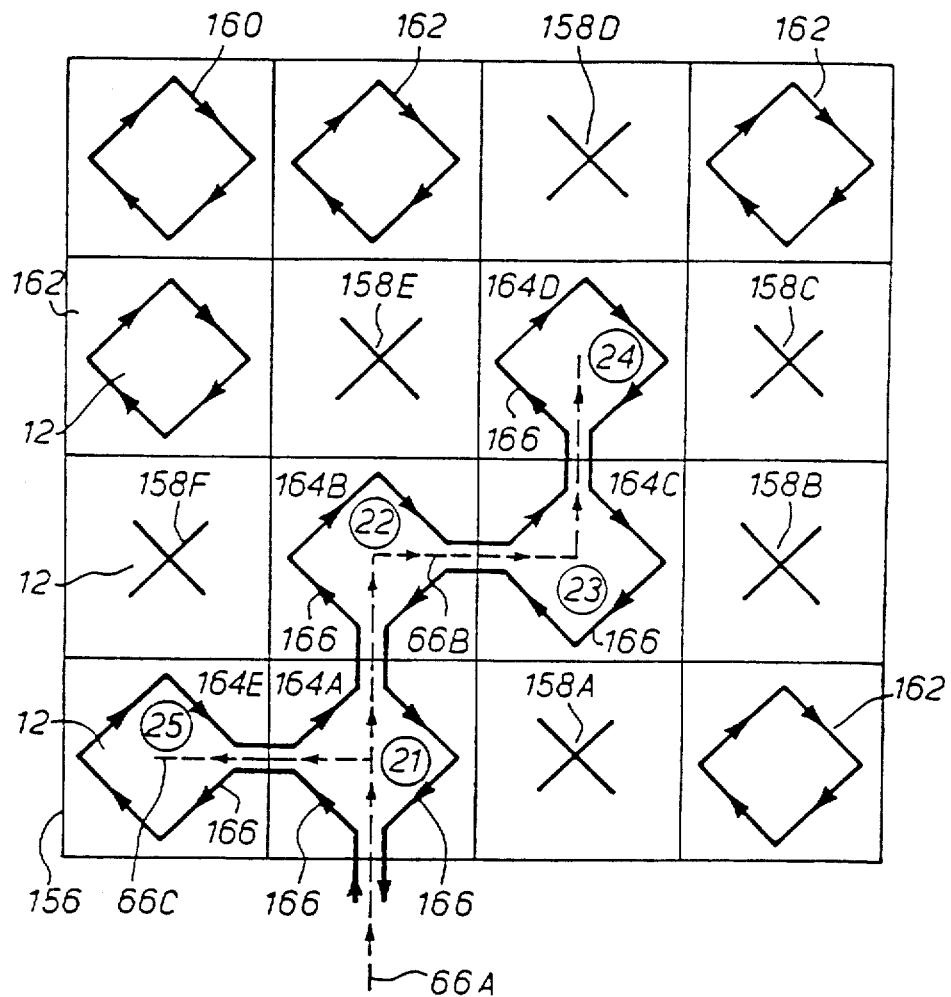
FIG. 11 shows an exemplary portion of the branched-spiral of interconnected cells established by the activities of FIG. 10.

FIG. 11 shows an exemplary array of cells 12 which the routine of FIG. 10 can grow on the wafer 10.

An exemplary block 156 of cells 12 is shown. Cells 12 incapable of passing the functional test are marked with a cross and are further indicated by the additional designation 158. Cells 12 which are capable of passing the functional test are shown with a circulating internal inconsequential data path 160 indicatively of the way data circulates therein when they are not accessed from a neighbor. They are further indicated by the designation 162. Cells 12 which have been accessed by a neighbor and have passed the functional test to become incorporated into the operation of the integrated circuit 8 are designated by the number 164. The data path 166 within each of the incorporated cells 164 as shown, together with the course taken by a first branch 66A of the data and address bus, a second branch 66B of the data and address bus, and a third branch 66C of the data and address bus.

A first cell 164A is entered from the south, tested, found to work, and confirmed in its coupling. The data path 166 then forms a loop within the first cell 164A. For the sake of example it is taken that the first cell 164A is given the cell name 21, being the 21st cell to be incorporated into the working of the integrated circuit 8, its name being included in a circle.

The controller 16 then commands the first cell 164A to test in the clockwise rotated direction from which it was tested. The first cell 164A accordingly approaches the first non-functional cell 158A. The first non-functional cell 158A does not pass the functional test and coupling to it from the first cell 164A is therefore abandoned. The controller 16, in response to the failure of the first non-functional cell 158A, swings the test direction back ninety degrees counter clockwise and commands the first cell 164A to access the second cell 164B which passes the functional test and therefore has coupling confirmed thereto. The data path 166 then forms a closed loop passing around and between the first and second cells 164A, 164B.

The command and address bus 66A, having been passed to the first cell 164A when it was incorporated, is passed on as a second branch 66B to the second cell 164B as it too is incorporated.

In response to the success of the second cell 164B is passing the test, the controller 16 rotates the test direction ninety degrees clockwise and commands the second cell 164B to access the third cell 164C which passes the test and is confirmed in its coupling to the second cell 164B. The second branch of the command and address bus 66B is passed on to the third cell 164C as it is incorporated. At this stage the data path 166 forms a loop passing right, round and between the first, second, and third cells 164A, 164B, 164C.

In response to the success of the third cell 164C in passing the test, the controller 16 continues to rotate the test direction by ninety degrees clockwise and commands the third cell 164C to approach the first non-functional cell 158A once more. There is no reason why this should not occur, since the failure of a cell 12 might be due to a weakness in coupling only in certain directions and a cell 12 failing on one approach might succeed on an approach from another direction. However, in the present example it is taken that the first non-functional cell 158A fails the test when approached from the third cell 164C. The controller, in response to the failure of the first non-functional cell 158A yet again, rotates the test direction counter-clockwise and commands the third cell 164C to access the second non-functional cell 158B which fails the test. In response to yet another failure, the controller 16 rotates the test direction by ninety degrees counter-clockwise once more and commands the third cell 164C to access the fourth cell 164D which passes the test and has coupling thereto confirmed, the second branch 66B of the command and address bus being provided to it as it is incorporated and the data path 166 forming a loop passing round and between the first, second, third, and fourth cells 164A, 164B, 164C, 164D.

The controller, in response to the success of the fourth cell 164D in passing the test, rotates the test direction ninety degrees clockwise and command the fourth cell 164D to access the third non-functional cell 158C, which fails the test. In response to the failure of the third non-functional cell 158C, the controller 16 swings the test direction ninety degrees counter clockwise and commands the fourth cell 164D to access the fourth non-functional cell 158D which fails the test. Once more the controller, in response to the failure of the fourth non-functional cell 158D, swings the test direction by ninety degrees counter-clockwise and commands the fourth cell 164D to access the fifth non-functional cell 158E which also fails the test. In response to the failure of the fifth non-functional cell 158E the controller swings the test direction a further ninety degrees counter-clockwise but discovers that this causes the test direction of the fourth cell 164D to be equal to its entry direction from the third cell.

The controller 16 therefore concludes that the fourth cell 164D is the tip of a cul-de-sac. The controller drops the last entry to its stack which points it back to the third cell 164C. At the same time the controller notes against the list entry for the fourth cell 164D that a backout operation was performed therefrom.

In backing out the controller 16 rotates the test direction clockwise and commands the third cell 164C to access the fourth cell 164D for testing. The third and fourth cells 164C, 164D are already coupled to one another. The fourth cell 164D therefore resists the approaches of the third cell 164C in the manner earlier described by temporarily disabling its gate 36 so that the fourth cell 164D appears to fail the test.

In response to the apparent failure of the fourth cell 164D the controller 16 rotates the test direction ninety degrees counter clockwise and commands the third cell 164C to access the second cell 164B for testing. The second cell 164B resists the approach of the third cell 164C, to which it already coupled, in the same way that the fourth cell 164D resisted the approaches of the third cell 164C. The second cell 164B therefore appears to fail the test.

In response to the apparent failure of the second cell the controller 16 rotates the test direction counter-clockwise by a further ninety degrees and commands the third cell 164C to approach the first non-functional cell 158A which fails the test as before. The controller 16 in response to yet another failure by the first non-functional cell 158A rotates the test direction counter clockwise and commands the third cell 164C to test the second non-functional cell once more, and it again fails the test. The controller 16 therefore concludes that all of the neighbors of the third cell 164C are inaccessible and therefore removes its entry from the top of the stack so pointing itself at the second cell 164B and notes against the entry for the third cell 164C in the list that a backout therefrom was performed and that it is therefore in a cul-de-sac.

The controller 16 performs the same operation for the second cell 164B as it performed for the third cell 164C and concludes that it too is part of the cul-de-sac.

The controller 16 therefore backs out to the first cell 164A once more, and, in performing the all round search, encounters the untested but workable fifth cell 164E to which it is coupled on completion of the functional test. The command and address bus 66C is coupled from the first cell 164A to the fifth cell 164E in a third branch. The data path 166 now forms a loop passing right round and between the first second, third, fourth and fifth cells 164A, 164B, 164C, 164D, 164E.

On each confirmation of connection, the controller 16 would write a unit incremented cell name into each cell 12 name register 92 of each cell 12. Thus the first cell 164A received the name 21, the second cell 164B received the name 22, the third cell 164C received the name 23, the fourth cell 164D received the name 24 and the fifth cell received the name 25. Each cell name is shown in FIG. 11 in a circular enclosure in its appropriate cell.

It is to be appreciated that further listing facilities in the controller 16 may be employed for noting cells which fail a functional test in terms of test directions so that on a backout no repeat testing of already tested and failed cells takes place.

The next move which the controller would make with respect to FIG. 11 would be to command the fifth cell 164E to access the sixth non-functional cell 158F for testing.

While the preferred embodiment of the invention has been described with reference to employing four data processing elements, it is to be appreciated that cells employing fewer than four data processing elements can be caused to be operable within the terms of the invention. The data path can be a simple branched-chain as opposed to the circulating loop of the embodiment herebefore described.

Whereas, in the foregoing description of the preferred embodiment the data processing elements 38 are described as memory modules, and generally permitted to be any kind of data processing element within the limitations before mentioned, it is to be appreciated that some or all of the data processing elements 38 can be replaced by other types of daa paths such as passive paths which do nothing to the through-passing data other than convey it, without disfunction of the embodiment of the present invention. It is further to be appreciated that the data processing elements 38 or data paths as above described can be different from cell to cell across the wafer.

What I claim is:

1. A data processing system comprising:
    an integrated circuit comprising a plurality of data-processing cells and a port, at least one of said plurality of cells being adjacent to said port, and
    a controller, coupled to said at least one of said cells via said port to pass data, commands and associated command addresses to said circuit, where;
    each of said plurality of cells is coupled to receive a connection from said controller, if not already in receipt of said connection, via a first neighboring cell, to receive a unique cell name from said controller, and to obey the associated command if a command address matches said unique cell name;
    each of said plurality of cells responds to said commands selectably to provide or cease to provide said connection to any selectable one or more than one other neighboring cell or cells;
    said controller tests each cell newly in receipt of said connection by the provision of test data thereto and the examination of return data therefrom; and where
    said controller issues commands to said cells to grow a branched-spiral of interconnected cells which have passed said test starting with said at least one of said cells.

2. A system according to claim 1 wherein said controller, in the event of having issued commands to the last cell to have received said connection and to have passed said test to provide said connection to each of its neighbours in turn and none of its neighbours has accepted said connection or passed said test, issues commands in turn to each of the cells which have accepted said connection and have passed said test in the reverse order to that of their having accepted said connection and having passed said test to provide said connection to each of their neighbouring cells in turn until a neighbouring cell is found which both accepts said connection and passes said test.

3. A system according to claim 2 wherein said controller in the event of a particular cell having passed said test, commands said particular cell to provide said connection to a neighboring cell next around in a predetermined sense of rotation from the direction from which said particular cell was in receipt of said connection, and in the event of said particular cell failing said test subsequently to receiving said connection, said controller commands said first neighboring cell to abandon said connection to said particular cell and to provide said connection to another neighboring cell next around in the opposite sense to said predetermined sense of rotation from said particular cell.

4. A system according to claim 3 wherein each of said plurality of cells is square and wherein said plurality of cells is arranged in a regular tesselation on a common semiconductor substrate for each cell to share boundaries with a maximum of four adjacent neighbouring cells, each cell comprising;
   four gates circuits, one being associated with each boundary, and
   four unidirectional data-processing elements coupled to act as a receiving element to receive data from a first gate circuit and to act as a feeding element to provide data to a second gate circuit, said second gate circuit being associated with the next boundary around said cell from the boundary with which said first gate circuit is associated in a predetermined sense of data rotation, where
   each of said gate circuits is coupled in a first manner to provide or receive said connection to or from the corresponding gate circuit in the boundary-sharing adjacent neighbouring cell and in a second manner to couple data from its associated feeding element to its associated receiving element.

5. A system according to claim 4 wherein said integrated circuit comprises a global connector provided in common to all of said plurality of cells and wherein said cell names, said commands and said command addresses are coupled between pairs of said cells by a common command coupling, said global connector providing indication as to whether the character on said common command coupling is a command, a command address or a cell name and each of said cells being responsive to said indication on said global connector to identify the nature of said character.

6. A system according to claim 5 wherein each of said plurality of cells comprises a cell name register coupled to receive the character on said common command coupling to store said character if and only if the cell is in receipt of said connection for the first time and said global connector provides indication that said character is a cell name.

7. A system according to claim 6 wherein each of said plurality of cells comprises:
   a command register for storing at least part of the character presented on said common command coupling if said global connector provides indication that a command is provided,
   a numerical comparator coupled to receive said at least part of said character stored in said cell name register as a first comparison input, coupled to receive the character currently-provided on said common command coupling as a second comparison input and responsive to said first and second comparison inputs to provide output indication of equality therebetween if and only if said global connector provides indication that said currently-provided character is a command address, and
   a command decoder coupled to receive said at least part of said character stored in said command register as a first input, coupled to receive said output of said comparator as a second input, and responsive to said indication on said global connector to decode the contents of said command register to interpret the command if and only if said global connector provides indication that said currently-provided character on said common command coupling is a command address.

8. A system according to claim 7 wherein said controller comprises a cell name counter, said controller coupling the count of said cell name counter to said commond command coupling whenever a cell is newly in receipt of said connection and incrementing the count of said cell name counter whenever a cell, newly in receipt of said connection, passes said test.

9. A system according to claim 8 wherein said controller comprises a stack memory for receiving each cell name for each cell which passes said test in the order of their having passed said test and for providing retreival of said received cell names in the reverse order of their receipt, said controller, in the event of a cell having no neighbouring cell which will accept said connection and pass said test, discarding the last entry in said stack memory and providing the previously stored entry therein as the new command address.

10. A system according to claim 9 wherein said controller compares the direction in which a cell, newly in receipt of said connection and having passed said test attempts to provide said connection to a further neighbouring cell with the direction from which said cell newly in receipt of said connection and having passed said test received said connection from said first neighbouring cell, and deems said cell, newly in receipt of said connection and having passed said test, to have no further neighbouring cell capable of accepting said connection and of passing said test, whenever said cell, newly in receipt of said connection and having passed said test, attempts to provide said connection to said first neighbouring cell.

11. A system according to claim 10 wherein said controller comprises a memory for maintaining a list, the contents of said list including; the cell name for each cell which has passed said test, associated indication of the direction wherefrom each cell which has passed said test was in receipt of said connection, and associated indication of any cell which has passed said test having been discovered to have no further neighbouring cell which will accept said connection and pass said test.

12. A system according to claim 11 wherein said controller includes means for re-establishing the connection pattern in said integrated circuit in response to the contents of said list without recourse to an iterative connection-pattern establishing routine.

13. A data processing system comprising:
   an integrated circuit comprising a plurality of data-processing cells and a port, at least one of said plurality of cells being adjacent to said port; and
   a controller, coupled to said at least one of said cells via said port to pass data, commands and associated command addresses to said circuit, where;
   each of said plurality of cells is coupled to receive a connection from said controller, if not already in receipt of said connection, via a first neighboring cell;
   where each of said plurality of cells comprises a cell name register for receiving from said controller and storing a unique cell name,
   where each of said plurality of cells comprises a command decoder coupled to receive a command word from said controller;
   where each of said plurality of cells comprises a comparator for detecting if a command address word matches said stored unique cell name to cause, in response to detection of a match between said unique cell name and said command address, said each cell to obey an associated command;

where each of said plurality of cells is responsive to said associated command selectably to provide or to cease to provide said connection to any selectable one or more than one other neighboring cell or cells;

where said controller tests each cell newly in receipt of said connection by the provision of data thereto and examination of return data therefrom;

where said controller issues commands to said cells to grow a branched spiral of interconnected cells which have passed said test starting with said at least one of said cells;

where said controller, in the event of having issued commands to the last cell to have received said connection and to have passed said test to provide said connection to each of its neighboring cells in turn and none of its neighboring cells has accepted said connection and passed said test, issues commands in turn to each of the cells which have accepted said connection and have passed said test in the reverse order to that of their having accepted said connection and having passed said test to provide said connection to each of their neighboring cells in turn until a further neighboring cell is found which both accepts said connection and passes said test.

14. A system according to claim 13, wherein each of said cells has four neighboring cells, wherein said controller, in the event of a particular cell having received said connection from a first neighboring cell and said particular cell having passed said test, commands said particular cell to provide said connection to another neighboring cell next around in a predetermined sense of rotation from the direction from which said particular cell was in receipt of said connection, and in the event of said particular cell failing said test subsequently to receiving said connection from said first neighboring cell, said controller commands said first neighboring cell to abandon said connection to said particular cell and commands said first neighboring cell to provide said connection to another adjacent neighboring cell next around in the opposite rotational sense from said first neighboring cell to said predetermined sense of rotation from said particular cell; said controller comparing the direction in which a newly-incorporated cell, newly in receipt of said connection and having passed said test, attempts to provide said connection to a further neighboring cell with the direction from which said newly-incorporated cell is in receipt of said connection from said first neighboring cell, and deems said newly-incorporated cell to have no further neighboring cells capable of accepting said connection and of passing said test whenever said newly-incorporated cell attempts for the first time to provide said connection to said first neighboring cell.

15. A system according to claim 14, wherein each of said plurality of cells is square and wherein said plurality of cells is arranged in a regular tesselation on a common semiconductor substrate for each cell to share boundaries with up to four adjacent neighboring cells, each cell comprising;

four gate circuits, one being associated with each boundary, and four unidirectional data-processing elements coupled to act as a receiving element to receive data from a first gate circuit and to act as a feeding element to provide data to a second gate circuit, said second gate circuit being associated with the next boundary around said cell from the boundary with which said first gate circuit is associated in a predetermined sense of data rotation, where each of said gate circuits is coupled to respond to said commands from said controller selectably to provide or receive said connection to or from the corresponding gate circuit in the boundary-sharing adjacent neighboring cell or to couple data from its associated feeding element to its associated receiving element.

16. A system according to claim 15, wherein said integrated circuit comprises a global connector provided in common to all of said plurality of cells and wherein said cell names, said commands and said command addresses are coupled between pairs of said cells by a common command coupling, said global connector providing indication as to whether the character on said common command coupling is a command, a command address or a cell name and each of said cells being responsive to said indication on said global connector to identify the nature of said character.

17. A system according to claim 16, wherein each of said plurality of cells comprises a cell name register coupled to receive the character on said common command coupling to store said character if and only if the cell is in receipt of said connection for the first time and said global connector provides indication that said character is a cell name.

18. A system according to claim 17, wherein each of said plurality of cells comprises;

a command register for storing at least part of the character presented on said common command coupling if said global connector provides indication that a command is provided, a numerical comparator coupled to receive said at least part of said unique character stored in said cell name register as a first comparison input, coupled to receive the character currently-provided on said common command coupling as a second comparison input and responsive to said first and second comparison inputs to provide output indication of equality there-between if and only if said global connector provides indication that said currently-provided character is a command address, and a common decoder coupled to receive said at least part of said character stored in said command register as a first input, coupled to receive said output of said comparator as a second input, and responsive to said indication on said global connection to decode the contents of said command register to interpret the command if and only if said global connector provides indication that said currently-provided character on said common command coupling is a command address.

19. A system according to claim 18 wherein said controller comprises a cell name counter for providing a non-repetitive sequence of count states, said controller coupling the count state of said cell name counter to said common command coupling whenever a cell is newly in receipt of said connection and said controller incrementing the count state of said cell name counter whenever a cell, newly in receipt of said connection, passes said test.

20. A system according to claim 19, wherein said controller comprises a stack memory coupled to receive and store each unique cell name for each cell which passes said test in the order of their having passed said test and for providing retrieval of said received unique cell names in the reverse order of their receipt, said controller, in the event of a cell having no neighboring cell which will accept said connection and pass said test, discarding the last unique cell name stored in said stack memory and providing the previously-stored unique cell name therein as the new command address.

21. A system according to claim 20, wherein said controller comprises a memory for maintaining a list, the contents of said list including; the cell unique name for each cell which has passed said test associated therewith, indication of the direction wherefrom each cell which has passed said test was in receipt of said connection, and further associated therewith, indication of any cell which has passed said test having been discovered to have no further neighboring cell which will accept said connection and pass said test, said controller thereafter providing means for re-establishing the connection pattern of cells in said integrated circuit in response to the contents of said list without recourse to an iterative connection-pattern establishing routine.

22. A data processing system comprising:
an integrated circuit comprising a plurality of data-processing cells and a port, at least one of said plurality of cells being adjacent to said port, and
a controller, coupled to said at least one of said cells via said port to pass data, commands and associated command addresses to said circuit, where;
each of said plurality of cells is coupled to receive a connection from said controller, if not already in receipt of said connection, via a first neighboring cell, to receive a unique cell name from said controller, and to obey the associated command if a command address matches said unique cell name;
each of said plurality of cells responds to said commands selectably to provide or cease to provide said connection to any selectable one or more than one other neighboring cell or cells;
said controller tests each cell newly in receipt of said connection by the provision of test data thereto and the examination of return data therefrom;
said controller issues commands to said cells to grow a branched-spiral of interconnected cells which have passed said test starting with said at least one of said cells; and wherein
said controller, in the event of a particular cell having passed said test, commands said particular cell to provide said connection to a neighboring cell next around in a predetermined sense of rotation from the direction from which said particular cell was in receipt of said connection, and in the event of said particular cell failing said test subsequently to receiving said connection, said controller commands said first neighboring cell to abandon said connection to said particular cell and to provide said connection to another neighboring cell next around in the opposite sense to said predetermined sense of rotation from said particular cell.

23. A system according to claim 22 wherein said controller, in the event of having issued commands to the last cell to have received said connection and to have passed said test to provide said connection to each of its neighbors in turn and none of its neighbors has accepted said connection or passed said test, issues commands in turn to each of the cells which have accepted said connection and have passed said test in the reverse order to that of their having accepted said connection and having passed said test to provide said connection to each of their neighboring cells in turn until a neighboring cell is found which both accepts said connection and passes said test.

24. A system according to claim 22 wherein each of said plurality of cells is square and wherein said plurality of cells is arranged in a regular tesselation on a common semiconductor substrate for each cell to share boundaries with a maximum of four adjacent neighboring cells, each cell comprising:
four gates circuits, one being associated with each boundary, and
four unidirectional data-processing elements coupled to act as a receiving element to receive data from a first gate circuit and to act as a feeding element to provide data to a second gate circuit, said second gate circuit being associated with the next boundary around said cell from the boundary with which said first gate circuit is associated in a predetermined sense of data rotation, where
each of said gate circuits is coupled in a first manner to provide or receive said connection to or from the corresponding gate circuit in the boundary-sharing adjacent neighboring cell and in a second manner to couple data from its associated feeding element to its associated receiving element.

25. A system according to claim 24 wherein said integrated circuit comprises a global connector provided in common to all of said plurality of cells and wherein said cell names, said commands and said command addresses are coupled between pairs of said cells by a common command coupling, said global connector providing indication as to whether the character on said common command coupling is a command, a command address or a cell name and each of said cells being responsive to said indication on said global connector to identify the nature of said character.

26. A system according to claim 25 wherein each of said plurality of cells comprises a cell name register coupled to receive the character on said common command coupling to store said character if and only if the cell is in receipt of said connection for the first time and said global connector provides indication that said character is a cell name.

27. A system according to claim 26 wherein each of said plurality of cells comprises:
a command register for storing at least part of the character presented on said common command coupling if said global connector provides indication that a command is provided,
a numerical comparator coupled to receive said at least part of said character stored in said cell name register as a first comparison input, coupled to receive the character currently-provided on said common command coupling as a second comparison input and responsive to said first and second comparison inputs to provide output indication of equality therebetween if and only if said global connector provides indication that said currently-provided character is a command address, and
a command decoder coupled to receive said at least part of said character stored in said command register as a first input, coupled to receive said output of said comparator as a second input, and responsive to said indication on said global connector to decode the contents of said command register to interpret the command if and only if said global connector provides indication that said currently-provided character on said common command coupling is a command address.

28. A system according to claim 27 wherein said controller comprises a cell name counter, said controller coupling the count of said cell name counter to said common command coupling whenever a cell is newly in receipt of said connection and incrementing the count of said cell name counter whenever a cell, newly in receipt of said connection, passes said test.

* * * * *